United States Patent
Andosca et al.

(10) Patent No.: US 12,483,162 B2
(45) Date of Patent: Nov. 25, 2025

(54) PIEZO-ELEMENTS FOR WEARABLE DEVICES, INCLUDING FITNESS TRACKERS, SMART WATCHES AND THE LIKE

(71) Applicant: Inviza LLC, Austin, TX (US)

(72) Inventors: Robert G. Andosca, Boston, MA (US); Todd Richard Christenson, Albuquerque, NM (US); Marcus Taylor, Uppsala (SE)

(73) Assignee: Inviza Corporation, Cambridge, MA (US)

( * ) Notice: Subject to any disclaimer, the term of this patent is extended or adjusted under 35 U.S.C. 154(b) by 729 days.

(21) Appl. No.: 17/373,690

(22) Filed: Jul. 12, 2021

(65) Prior Publication Data

US 2022/0014120 A1 Jan. 13, 2022

Related U.S. Application Data

(60) Provisional application No. 63/060,455, filed on Aug. 3, 2020, provisional application No. 63/050,334, filed on Jul. 10, 2020.

(51) Int. Cl.

| | |
|---|---|
| *H02N 2/18* | (2006.01) |
| *A43B 13/28* | (2006.01) |
| *H01L 41/04* | (2006.01) |
| *H01L 41/08* | (2006.01) |
| *H01L 41/187* | (2006.01) |

(Continued)

(52) U.S. Cl.
CPC ............ *H02N 2/188* (2013.01); *A43B 13/28* (2013.01); *H02N 2/181* (2013.01);
(Continued)

(58) Field of Classification Search
CPC ...... H02N 2/181; H02N 2/188; H10N 30/093; H10N 30/098; H10N 30/802;
(Continued)

(56) References Cited

U.S. PATENT DOCUMENTS

| | | | |
|---|---|---|---|
| 8,348,841 B2 | 1/2013 | Varadan | |
| 9,106,322 B2 * | 8/2015 | Bagshaw | ................ G01S 15/96 |

(Continued)

OTHER PUBLICATIONS

Requirement for Restriction/Election Mailed on Dec. 4, 2023 for U.S. Appl. No. 17/573,061, 7 page(s).

(Continued)

*Primary Examiner* — Emily P Pham
*Assistant Examiner* — Monica Mata
(74) *Attorney, Agent, or Firm* — Kaplan Breyer Schwarz, LLP

(57) ABSTRACT

Systems methods, and structures are provided that scavenge mechanical energy to provide electrical energy to a wearable, where the mechanical energy is scavenged by a bending-strain-based transducer that includes a non-resonant energy harvester. The bending-strain-based transducer also includes a sensor and/or a haptic device. The transducer may comprise a piezoelectric layer comprising a low-K piezoelectric material, such as aluminum nitride, which enables generation of higher voltage and power/energy output and/or a thinner transducer. Transducers in accordance with the present disclosure can be included in wearables for which large transducer thickness would be problematic, such as shoe insoles, midsoles or outsoles, garments, bras, handbags, backpacks, and the like.

31 Claims, 12 Drawing Sheets

(51) Int. Cl.
   *H01L 41/193* (2006.01)
   *H01L 41/39* (2013.01)
   *H01L 41/45* (2013.01)
   *H10N 30/00* (2023.01)
   *H10N 30/093* (2023.01)
   *H10N 30/098* (2023.01)
   *H10N 30/80* (2023.01)
   *H10N 30/853* (2023.01)
   *H10N 30/857* (2023.01)

(52) U.S. Cl.
   CPC ......... *H10N 30/093* (2023.02); *H10N 30/098* (2023.02); *H10N 30/101* (2024.05); *H10N 30/802* (2023.02); *H10N 30/853* (2023.02); *H10N 30/8554* (2023.02); *H10N 30/857* (2023.02)

(58) Field of Classification Search
   CPC ............... H10N 30/853; H10N 30/857; H10N 30/1071; H10N 30/8554; A43B 13/28
   USPC ........................................................ 310/311
   See application file for complete search history.

(56) References Cited

U.S. PATENT DOCUMENTS

| | | | |
|---|---|---|---|
| 10,131,993 | B2 | 11/2018 | Varadan et al. |
| 10,231,623 | B2 | 3/2019 | Varadan et al. |
| 10,438,772 | B2 | 10/2019 | Varadan et al. |
| 10,653,316 | B2 | 5/2020 | Varadan et al. |
| 2005/0192129 | A1* | 9/2005 | Kuwabara ............... A63B 60/46 473/520 |
| 2016/0183835 | A1 | 6/2016 | Varadan |
| 2016/0222539 | A1 | 8/2016 | Varadan et al. |
| 2017/0208890 | A1 | 7/2017 | Torvinen et al. |
| 2017/0226643 | A1 | 8/2017 | Varadan et al. |
| 2017/0354372 | A1 | 12/2017 | Varadan et al. |
| 2018/0153512 | A1* | 6/2018 | Akkaraju ................ G01S 7/521 |
| 2018/0325407 | A1 | 11/2018 | Varadan et al. |
| 2019/0048473 | A1 | 2/2019 | Varadan et al. |
| 2019/0086361 | A1 | 3/2019 | Varadan et al. |
| 2020/0006035 | A1 | 1/2020 | Varadan et al. |

OTHER PUBLICATIONS

Robert Andosca et al., "Experimental and theoretical studies on MEMS piezoelectric vibrational energy harvesters with mass loading", "Sensors and Actuators A: Physical", Feb. 28, 2012, Publisher: Elsevier B.V., doi:10.1016/j.sna.2012.02.028, pp. 76-87.

Final Rejection Mailed on Dec. 30, 2024 for U.S. Appl. No. 17/573,061, 20 page(s).

Non-Final Rejection Mailed on Apr. 5, 2024 for U.S. Appl. No. 17/573,061, 20 page(s).

* cited by examiner

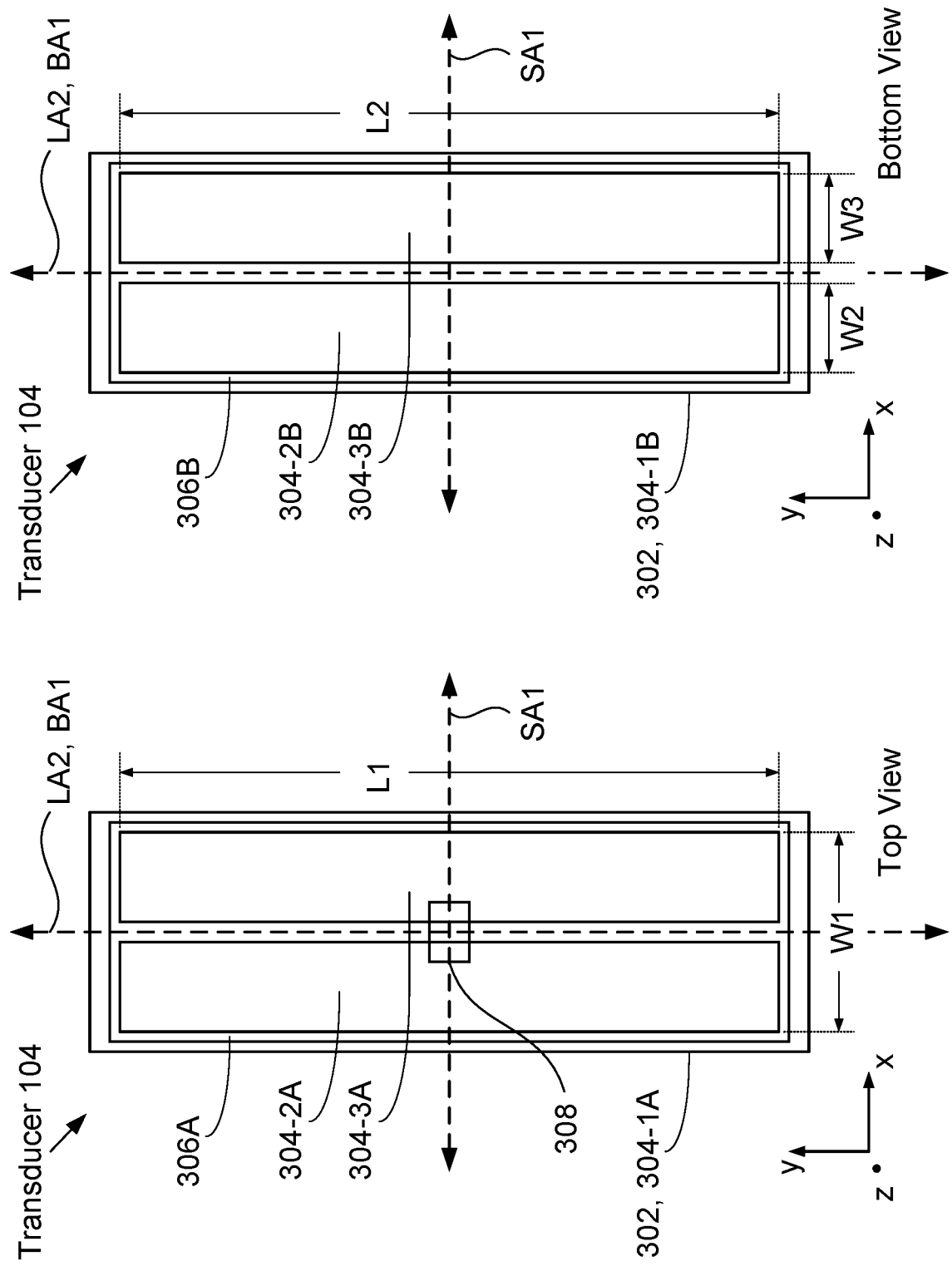

Connectivity Diagram 500

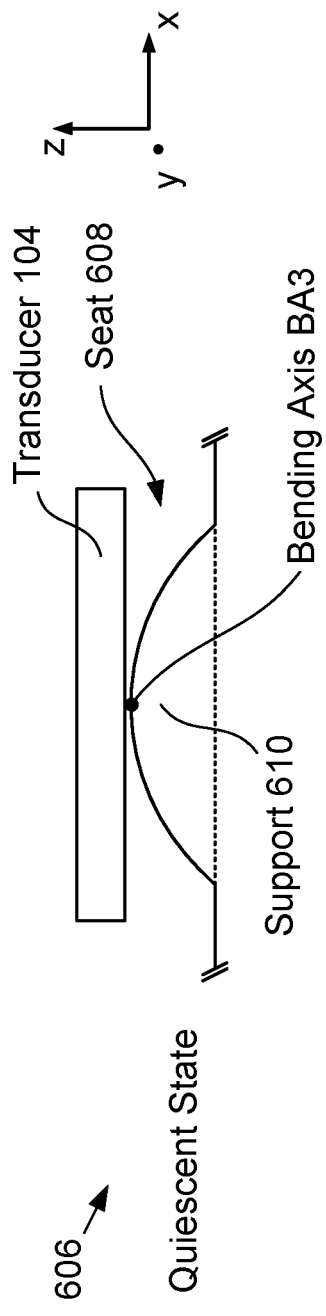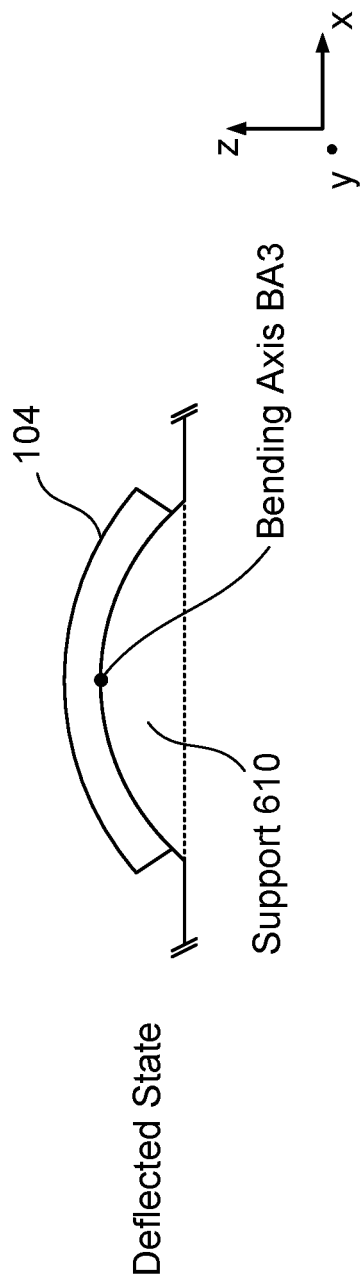
FIG. 6B
FIG. 6C

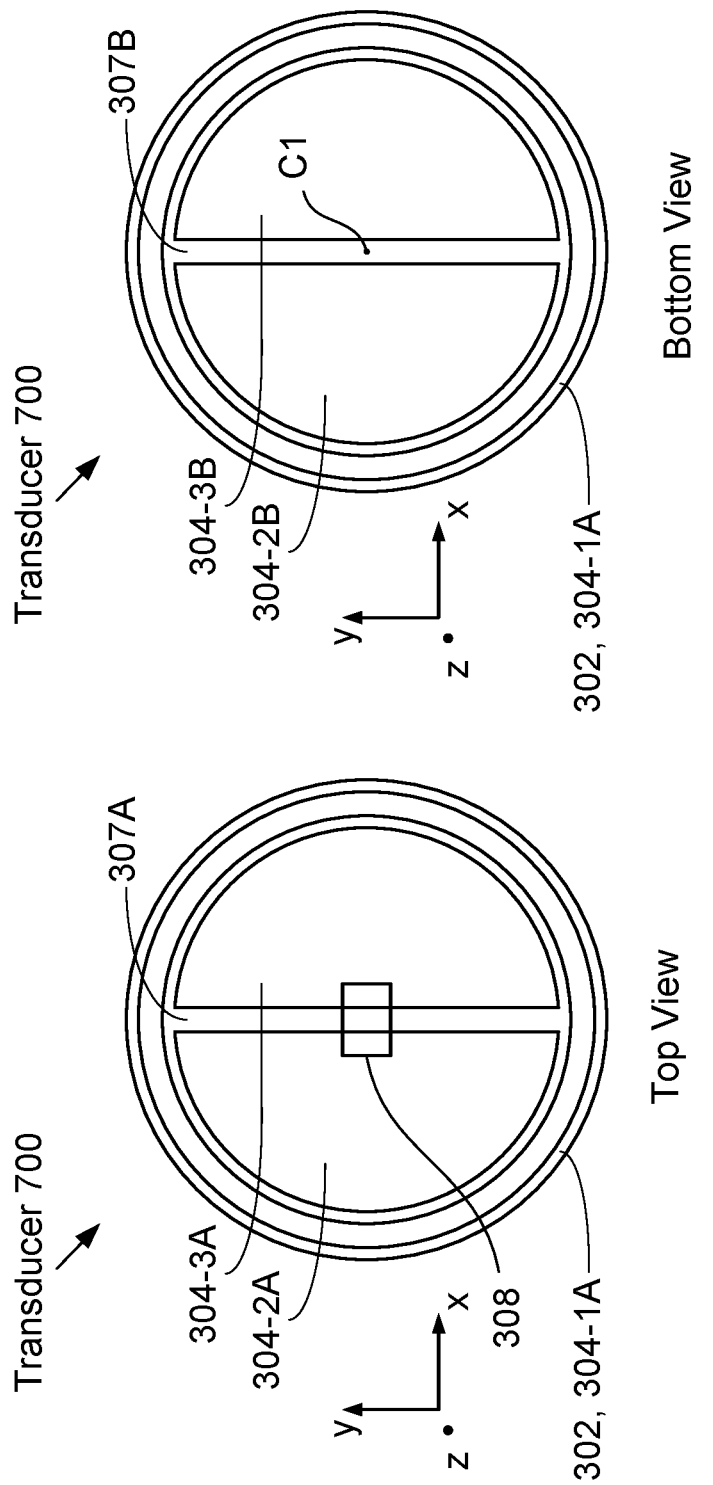

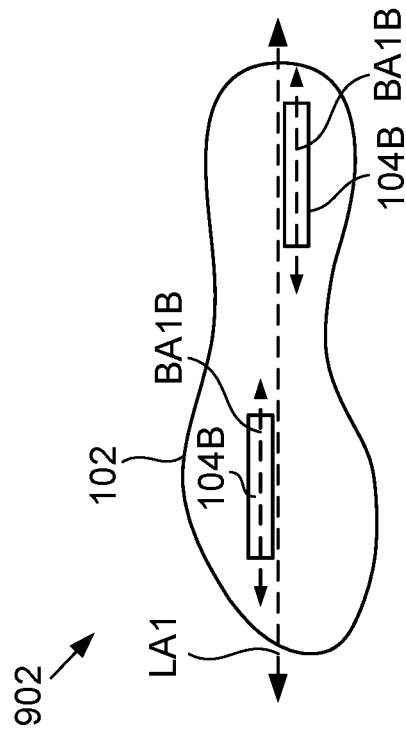
FIG. 9A
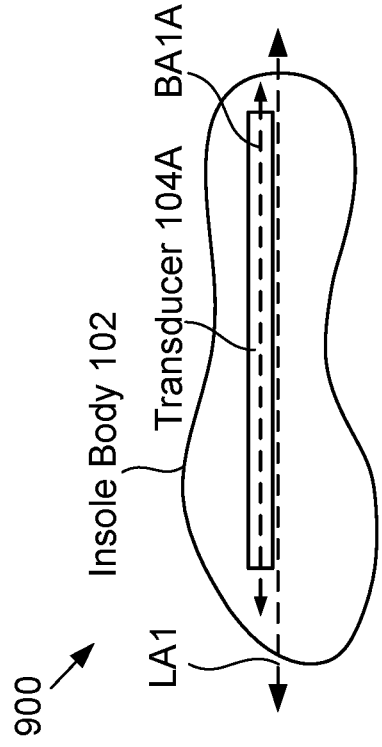
FIG. 9B
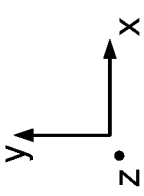
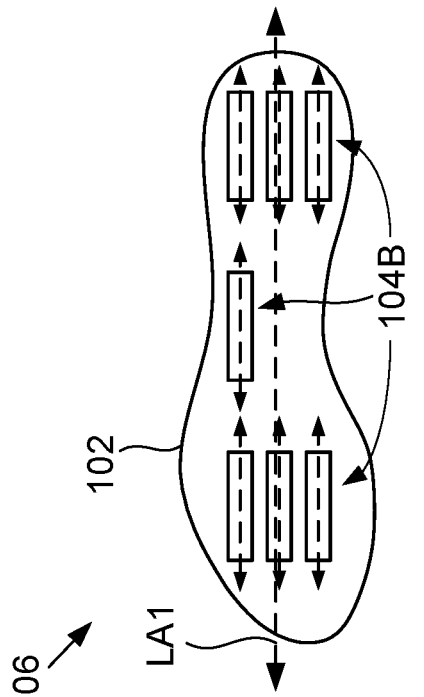
FIG. 9C
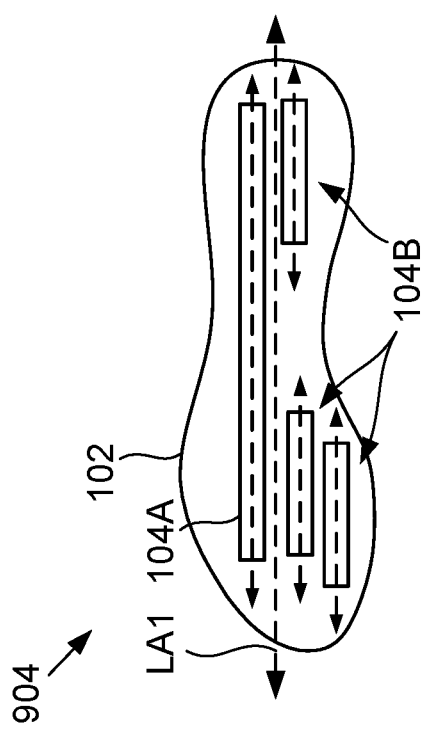
FIG. 9D

PIEZO-ELEMENTS FOR WEARABLE DEVICES, INCLUDING FITNESS TRACKERS, SMART WATCHES AND THE LIKE

CROSS REFERENCE TO RELATED APPLICATIONS

This application claims the benefit of U.S. Provisional Application Ser. No. 63/050,334, filed Jul. 10, 2020, entitled "Piezo-Elements for Wearable Devices," and U.S. Provisional Application Ser. No. 63/060,455, filed Aug. 3, 2020, entitled "Corrugated Piezo-Elements for Wearable Devices," each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to smart wearable systems in general, and, more particularly, to self-powered sensors and actuators suitable for inclusion in a wearable, such as smart clothing for use by humans and/or animals such as, garments, footwear, accessories, and the like.

BACKGROUND

Wearables, such as fitness trackers and smart watches have become increasingly popular over the past few years. These devices and systems have evolved to the point at which they can connect with other devices, like computers and smartphones, thereby enhancing their overall capabilities.

Unfortunately, one area that remains a challenge is providing power to wearables—particularly as more systems and sub-systems are included to augment their capabilities. For example, many contemporary wearables include rechargeable batteries. Unfortunately, rechargeable batteries must be frequently connected to a charging station of some sort, during which time the wearable is typically out of service.

Furthermore, the capacity of many rechargeable batteries (e.g. Lithium ion "Li+" or Lithium polymer "LiPo", etc.) degrades over time to a point where the wearable becomes inoperative.

The need for a self-powered wearable that requires little or no downtime for recharging remains, as yet, unmet in the prior art.

SUMMARY

The present disclosure is directed toward self-powered wearables for users/subjects such as humans, animals, robotics, exoskeletons, and the like. Embodiments in accordance with the present disclosure are suitable for use in accessories and/or garments for humans, such as clothing, shoes, sandals, exercise equipment and clothing, cell phone cases, luggage (e.g., suitcases, backpacks, etc.), purses, undergarments (e.g., bras, socks, footwear insoles, etc.), human-machine interfaces (e.g., joysticks, position-sensing-gloves, etc.), smart gloves, and the like, as well as garments and/or accessories for animals, such as horseshoes, leashes, collars, and the like.

An advance over the prior art is realized by incorporating a non-resonant energy harvester into a wearable to power one or more devices, such as sensors, haptic devices, wireless communication devices, and the like, where the energy harvester is configured to generate electrical energy in response to strain induced by bending rather than compression. By configuring the energy harvester such that it functions substantially as a bending-strain-based device, it can generate significantly more power than those known in the prior art. Furthermore, some energy harvesters in accordance with the present disclosure employ a low dielectric-constant (K) or "low-K" piezoelectric material, which enables high-voltage V/power P operation and/or a significantly thinner energy harvester or sensor transducer. To first order, voltage V generated is proportional to $(d_{31}/K)$ and the power P generated is proportional to $(d_{31}^2/K)$.

An illustrative embodiment in accordance with the present disclosure is a smart shoe insole comprising a processor, an energy storage unit, a wireless communications module, a geolocation module, and plurality of multi-function, bending-strain-based, bimorph transducers. Each bimorph transducer includes three low-K piezoelectric transducer elements configured as a piezoelectric bending-strain-based energy harvester, a pressure sensor, and a haptic device.

In each bimorph transducer, the energy harvester is disposed on the front side of a stainless-steel substrate and the pressure sensor and haptic device are disposed on the backside of the substrate. The bimorph transducer is configured to enable the substrate to bend out of its planar quiescent shape in response to a force applied normally to the transducer. Each bimorph transducer has a rectangular outline having a long axis and a short axis, where the long axis defines a bending axis for the transducer.

The plurality of bimorph transducers is arranged such that each short axis is substantially aligned with the longitudinal axis of the insole, thereby orienting each of the bending axes perpendicularly to the longitudinal axis of the insole. Such an arrangement enables the transducers to easily move relative to one another (like the panels of a Venetian blind) during a typical step of a user.

In some embodiments, at least one transducer of the plurality of bimorph transducers is configured within an insole such that its long and bending axes are substantially aligned with the longitudinal axis of the insole. In some embodiments, at least one transducer of the plurality of bimorph transducers is configured within an insole such that none of its short, long, and bending axes is aligned with the longitudinal axis of the insole.

In some embodiments, a wearable other than an insole is characterized by a characteristic axis (e.g., a longitudinal axis) and includes at least one transducer. In such embodiments, the bending axis of one or more of the transducers included in the wearable can have any desired alignment relative to the characteristic axis (e.g., perpendicular to its characteristic axis, aligned with the characteristic axis, or neither aligned with nor perpendicular to the characteristic axis).

In the illustrative embodiment, the piezoelectric material of each transducer element is low-K aluminum nitride (AlN), which enables high-voltage operation using a very thin piezoelectric layer. In some embodiments, at least one transducer element of a bimorph transducer comprises a different low-K piezoelectric material (e.g., scandium-doped AlN, undoped ZnO, doped zinc oxide (ZnO), polyvinylidene fluoride (PVDF), doped PVDF, lithium niobate (LiNbO$_3$), etc.). In some embodiments, the piezoelectric material is deposited by a suitable technique other than magnetron sputtering, such as non-magnetron sputtering, plasma-deposition technique, and the like.

In some embodiments, the piezoelectric material of at least one transducer element is a high-K material, such as Sol-gel lead-zirconate-titanate (PZT), thick doped Sol-gel PZT, and the like.

In some embodiments, a transducer is configured to substantially selectively enable a bending mode of operation while simultaneously inhibiting compression of the piezoelectric layer of its non-resonant energy harvester.

In some embodiments, a transducer is a monomorph that includes one or more transducer elements on only the top or bottom of a substrate.

In some embodiments, at least one of the bimorph transducers is bent in its quiescent state such that its substrate is non-planar. In such embodiments, the bimorph transducer responds to an applied force by unbending such that its substrate becomes less non-planar and, in some cases, planar.

In some embodiments, a bimorph transducer includes at least one projection that extends outward from one side of the bimorph transducer to enable it to function as a support that mitigates compression of at least one of its piezoelectric layers and/or as a focal point about which the transducer can bend in response to the applied force.

In some embodiments, a bimorph transducer is configured as only a non-resonant energy harvester that comprises a non-resonant energy-harvester element located on both sides of the substrate.

In some embodiments, a wearable includes one or more sensors that are external to the bimorph transducers, such as a pulse-oximetry sensor, an accelerometer, a gyroscopic sensor, a temperature sensor, a force, load, one or more pressure sensors, a haptic device, and the like.

An embodiment in accordance with the present disclosure is an apparatus comprising: a bending-strain-mode transducer having a longitudinal axis that defines a first direction, wherein the transducer includes: (i) a first transducer element disposed on a first surface of a substrate, the first transducer element being a non-resonant energy harvester; (ii) a second transducer element disposed on a second surface of the substate, the first and second surfaces being on opposite sides of the substrate, wherein the second transducer element is selected from the group consisting of a non-resonant energy harvester, a force sensor, a load sensor, a pressure sensor, and a haptic device; wherein the transducer is configured to bend in response to a first force that is at least partially directed along a second direction that is orthogonal to the first direction, and wherein the transducer is configured to inhibit compression of at least one of the first and second transducer elements along the second direction in response to the first force.

Another embodiment in accordance with the present disclosure is an apparatus comprising a first bimorph transducer having a first longitudinal axis that defines a first direction, wherein the first bimorph transducer includes: a first transducer element disposed on a first surface of a substrate, the first transducer element being a non-resonant energy harvester; wherein the first bimorph transducer is configured to bend in response to a first force directed at least partially along a second direction that is orthogonal to the first direction.

Yet another embodiment in accordance with the present disclosure is a method comprising forming a first transducer by operations that include: providing a substrate having first electrode on a first surface and a second electrode on a second surface, wherein the first and second surfaces are on opposite sides of the substrate, and wherein the substrate is configured to bend in response to a first force directed at least partially along a second direction that is orthogonal to the first direction; forming a first piezoelectric layer on the first electrode; forming a second piezoelectric layer on the second electrode; forming a third electrode on the first piezoelectric layer; and forming a fourth electrode on the second piezoelectric layer; wherein the first piezoelectric layer, first electrode, and third electrode collectively define a first transducer element that is a bending-strain-based, non-resonant energy harvester; and wherein the second piezoelectric layer, second electrode, and fourth electrode collectively define a second transducer element that is selected from the group consisting of a non-resonant energy harvester, a force sensor, a load sensor, a pressure sensor, and a haptic device.

BRIEF DESCRIPTION OF THE DRAWINGS

FIGS. 3A-C depict schematic drawings of cross-sectional, top, and bottom views, respectively, of a representative transducer 104 in accordance with the illustrative embodiment.

FIGS. 6B-C depict schematic drawings of a cross-sectional view of another alternative embodiment of a transducer in its quiescent and deflected states, respectively, in accordance with the present disclosure.

FIGS. 7A-B depict schematic drawings of top and bottom views, respectively, of yet another alternative embodiment of a transducer in accordance with the present disclosure.

FIGS. 9A-D depict schematic drawings of cross-sectional views of wearables having alternative arrangements of bimorph transducers within a wearable in accordance with the present disclosure.

DETAILED DESCRIPTION

Figure 1:
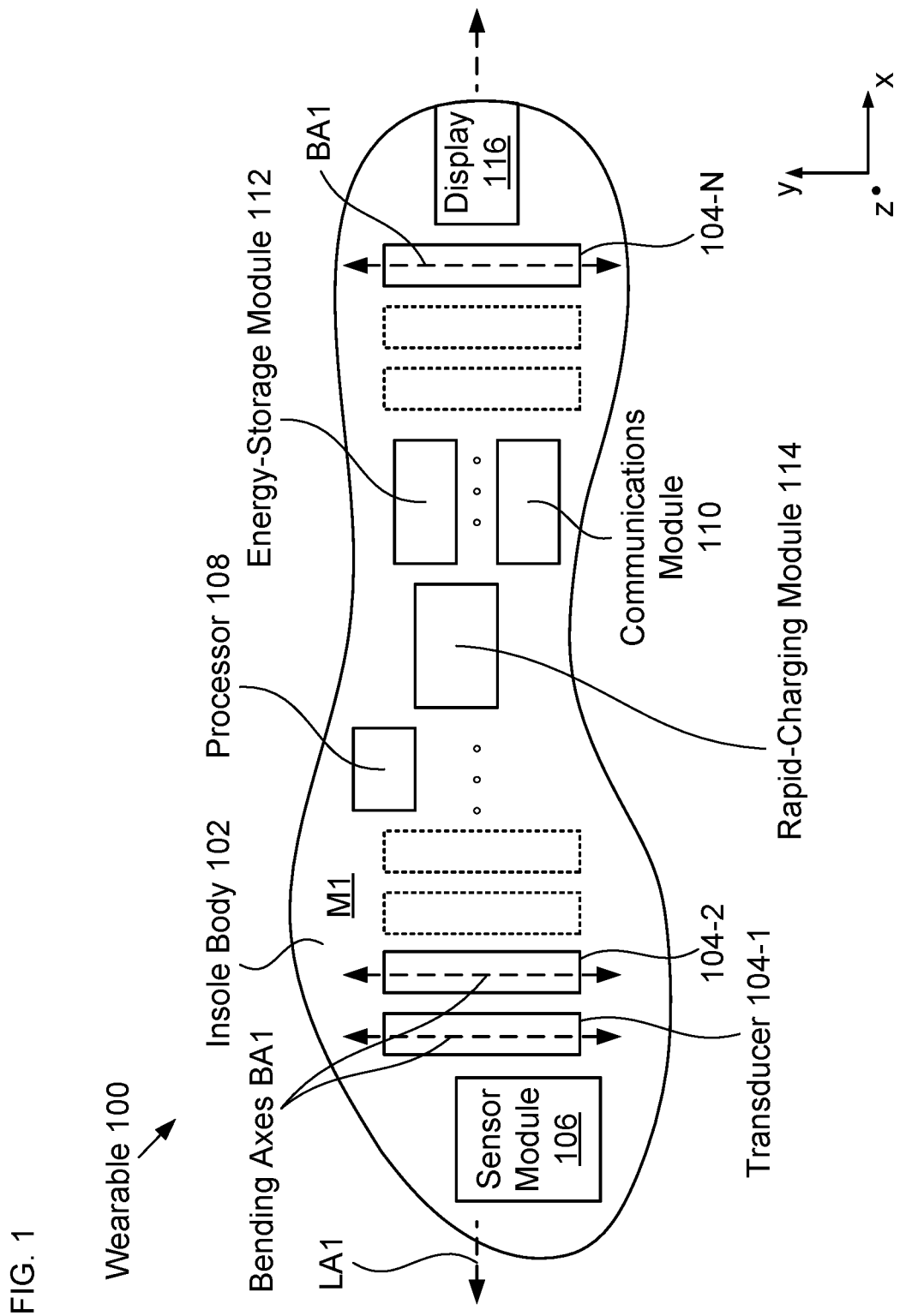
FIG. 1 depicts a schematic drawing of a plan view of an illustrative embodiment of a wearable in accordance with present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

The following terms are defined for use in this Specification, including the appended claims:

"wearable" is defined as an object meant to be worn, used, and/or carried by a user where the object includes at least one transducer, such as a sensor, haptic device, etc., and where the user can be a human or an animal. A wearable, as used herein, includes garments, undergarments (e.g., bras, shoe insoles, etc.), shoes, fashion electronics (e.g., fitness trackers, smart watches, etc.), accessories (e.g., backpacks, cell phone cases, purses, wallets, etc.), sporting equipment (e.g., fitness bands, etc.), horseshoes, leashes, tethers, collars, and the like.

"bending-strain-based transducer" is defined as a transducer that is configured to bend about a bending axis located in a plane in response to a force applied at least partially along a direction normal to that plane. For example, a normally flat bending-strain-based transducer lies in a first plane when in its quiescent state but will bend out of the first plane in response to the force, while a normally curved bending-strain-based transducer will become flatter, or completely flat, in response to the force. Bending of a bending-strain-based transducer in accordance with the present disclosure can manifest as an induced curvature that is substantially uniform across at least one lateral dimension of the device or as a localized bend that occurs at one or more localized points of the device, such as at a point of support for a cantilevered or doubly-supported element.

"non-resonant energy harvester" is defined as an energy harvester that does not require a driving force at or near its natural resonant frequency to generate voltage and/or electrical power. For example, a non-resonant energy harvester can generate voltage and/or electrical power in response to an aperiodic stimulus or the application of a substantially constant force.

"aligned" is defined as being co-linear or parallel with. For example, two elements that are aligned can either be arranged along the same axis or arranged such that they are parallel with one another.

"low-K piezoelectric material" is defined as a piezoelectric material having a dielectric constant that is less than or equal to 30 at room temperature.

"high-K piezoelectric material" is defined as a piezoelectric material having a dielectric constant that is greater than or equal to 100 at room temperature.

FIG. 1 depicts a schematic drawing of a plan view of an illustrative embodiment of a wearable in accordance with present disclosure. Wearable 100 is a shoe insole that can be reversibly inserted into a shoe. In the depicted example, wearable 100 comprises insole body 102, transducers 104-1 through 104-N, sensor module 106, processor 108, energy-storage module 110, communications module 112, rapid-charging module 114, and display 116.

It should be noted that, although wearable 100 is a shoe insole, the teachings of the present disclosure can be applied to virtually any wearable suitable for use by a human, an animal, a robot, or as part of an exoskeleton. Furthermore, the teachings of the present disclosure, when applied to footwear (e.g., shoes, sneakers, cleats, slippers, etc.), are not limited to reversibly insertable insoles but, rather, can be applied to shoe insoles that are permanently joined to a shoe, outsoles, mid-soles (e.g., for high heel shoes, etc.), or to footwear that is, itself, a wearable comprising integrated non-resonant energy harvesters, sensors, and the like.

Figure 2:
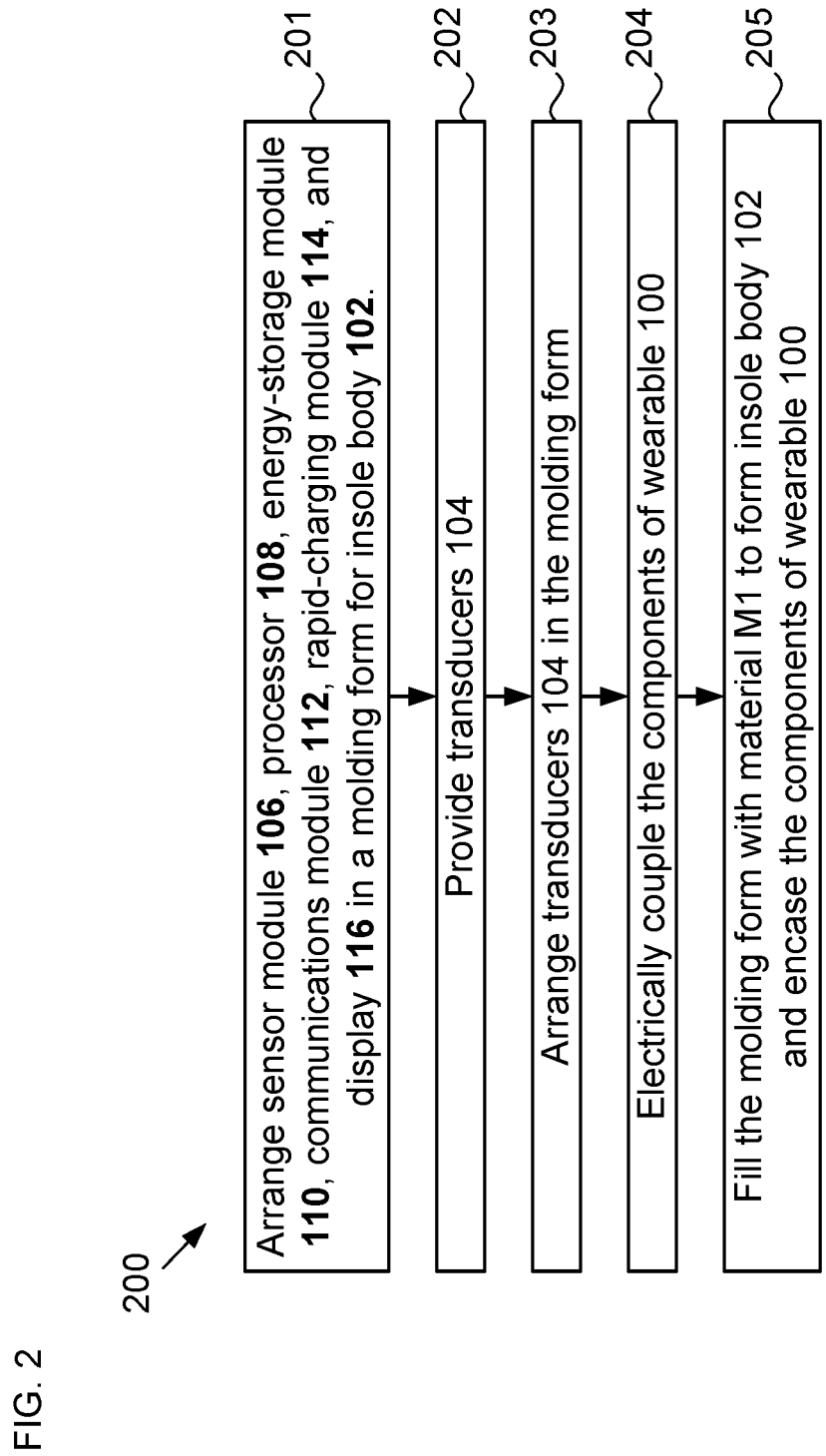
FIG. 2 depicts operations of a method for forming a wearable in accordance with present disclosure.

FIG. 2 depicts operations of a method for forming a wearable in accordance with present disclosure. Method 200 begins with operation 201, wherein sensor module 106, processor 108, energy-storage module 110, communications module 112, rapid-charging module 114, and an optional display 116 are arranged in a molding form suitable for the formation of insole body 102.

Insole body 102 is a conventional shoe insole comprising a resilient material suitable for providing cushioning to the user. Insole body 102 is a substantially "foot-shaped" body comprising material M1. Insole body 102 is characterized by longitudinal axis LA1, which is substantially aligned with the long dimension of the insole body (i.e., from the heel to the toes of the user, or vice versa).

Each of transducers 104-1 through 104-N (referred to, collectively, as transducers 104) is a multi-function bimorph transducer that includes a non-resonant energy harvester that is configured to operate in bending mode rather than compression. In the depicted example, each of transducers 104 includes a non-resonant energy harvester, a pressure sensor, and a haptic device for providing a sensory signal to the user.

A representative transducer 104 is described in more detail below and with respect to FIGS. 3A-C.

Sensor module 106 includes one or more sensors for measuring user-based and/or environmental parameters other than pressure. Examples of sensors suitable for inclusion in sensor module 106 include, without limitation, temperature sensors, chemical sensors (e.g., oxygen sensors, humidity sensors, salinity sensors, electrolyte sensors, ion sensors, etc.), volatile organic compound (VOC) sensors for measuring ambient concentrations of "reducing gases" associated with air quality—e.g. alcohols, aldehydes, ketones, organic adds, amines, organic chloramines, aliphatic and aromatic hydrocarbons (e.g. for detection of the onset of "athletes foot" or other ailments), GPS sensors, accelerometers, gyroscopes, inertial sensors, optical sensors, including but not limited to pulse-oximetry sensors, carbon dioxide sensors, blood-alcohol sensors, glucose sensors, infrared (IR) temperature sensors, and the like.

In the depicted example, sensor module 106 includes a GPS system, a pulse-oximetry sensor, and a multi-axis accelerometer. The GPS system provides location and elevation information to processor 108 and transmits and receives information to/from communications module 110.

The pulse-oximetry sensor provides user-centric data to processor 108, such as heart rate and blood oxygen level. Respiratory rate and burned calories can be calculated from heart rate. It is known that the respiratory rate calculation is accurate, yet the burned calories of contemporary wearable smart watches using this conversion technique are known to be inaccurate.

The multi-axis accelerometer enables wearable 100 to detect walking, running, skipping, etc., as well as calculation of burned calories by the human or animal body with an accuracy that greater exceeds the accuracy possible in the prior art. The aforementioned heart rate calculation method is used in combination with the multi-axis accelerometer to obtain these superior results via a computer software algorithm.

It is an aspect of the present disclosure that calorie burning can be determined with higher accuracy than possible in the prior art because transducer 100 enables measurement of the actual mechanical power expended, where P=(force F=mass m*acceleration $a_{x, y \text{ or } z}$)*(speed S=$a_{x, y \text{ or } z}$*time t), which can then be converted to human power (or animal power) using a known conversion factor to determine calories burned with less than 5% inaccuracy. Prior-art systems use only the measured heart rate to calculate burned calories, which has been found to be 27% to 93% inaccurate.

The multi-axis accelerometer also enables wearable 100 to detect potentially catastrophic events, such as a fall by the user, as well as assess user behavior, such as after a fall has been detected. For example, the accelerometer enables detection of a lack of movement (potentially indicating a state of unconscious), rapid, random movements (potentially indicating onset of a seizure), movements indicative of crawling (e.g., to call for help, etc.), as well as other user-centric behavior, such as when the user is lying down, etc.

In some embodiments, a second, external multi-axis accelerometer (e.g., located in a wrist band, a chest band, a garment, a smart watch, a fitness tracker, etc.) is used in conjunction with wearable 100 to provide additional information regarding upper body movements. Such an arrangement enables better determination of the calories burned by the upper body, providing improved accuracy for overall calorie-burn calculations.

In some embodiments, the location of the pulse-oximetry sensor, IR temperature sensor or other optical sensor within wearable 100 is carefully selected relative to advantageously position it relative to the blood vessels (e.g., arteries carrying oxygen laden red blood cells) in the body portion of the user with which it is to be operatively coupled.

Processor 108 includes processing circuitry, control circuitry, memory, and the like, that is configured to, among other things, send and receive signals to/from transducers 104 and sensor module 106, execute instructions, analyze and store data, and transmit and receive signals to/from communications module 112. In the depicted example, the processor is implemented as a single, discrete component within wearable 100; however, in other embodiments, the processor can be distributed, at least in part, among multiple components in wearable 100, implemented, in part or in full, in a remote or cloud-based computing system, or otherwise implemented in a suitable arrangement for carrying out the functions described herein. In some embodiments, some or all of the capability of processor 108 is incorporated into communications module 110.

Communications module 110 is configured to enable wireless communications to and from wearable 100. In some embodiments, communications module 110 employs one or more communications systems, such as Bluetooth® low-energy (BLE) communications system, LoRa, long-range cellular, satellite, Bluetooth®, WiFi, Zigbee, A-wave, radio frequency (RF), and the like. In the depicted example, communications module 110 includes a LoRa communications system and a Bluetooth® low-energy (BLE) communications system. The LoRa communications system is configured to transmit and receive GPS data to/from wearable 100 via cellular communications networks, while the BLE system is configured to communicate with processor 108 and other components within wearable 100. In the depicted example, the BLE system is also configured to communicate with a base station, such as a dedicated base station or a mobile device running a dedicated app for interfacing to wearable 100.

It should be noted that the relatively larger amount of space available in an insole than, for example, in a mobile phone, enables the communications antennae of communications module 110 to be designed to enable better reception and more consistent transmission to/from their respective paired devices.

It is an aspect of the present disclosure that the inclusion of a GPS system in sensor module 106 and a communications module that communicates with a mobile device, such as a cell phone, tablet, etc., enables high-level functionality, such as computer applications that enable location of a wearable at any time, or an alarm when a distance between the wearable and base station or mobile device exceeds a threshold. This is particularly useful for locating a user that might require assistance (e.g., a missing child, a "wandering" lost Alzheimer's patient, an intoxicated user, a missing camper/hiker/skier, a lost animal, a missing robot, etc.).

Energy-storage module 112 includes power-handling circuitry (e.g., AC to DC rectification, etc.) and one or more energy storage units. Energy-storage module 112 is operatively coupled with each of transducers 104 and configured to store energy generated by their respective non-resonant energy harvesters, as well as provide power to the transducers and the other electronics included in wearable 100. In the depicted example, energy-storage module 112 includes a lithium-polymer battery suitable for storing enough charge for several hours/days of normal use. In some embodiments, energy-storage module 112 includes one or more super capacitors and/or a different energy-storage device, such as a rechargeable battery, a rechargeable standard capacitor, a hybrid-system of a primary battery and/or a rechargeable battery and/or a super capacitor and/or a capacitor, and the like.

Rapid-charging module 114 is optionally included in wearable 100 and includes an interface for electrically coupling to an external power source to rapidly charge the energy storage units of energy-storage module 112. In the depicted example, rapid-charging module 114 includes an inductive-charging coil sub-system and associated circuitry. In some embodiments, the rapid-charging module includes a different interface that enables electrical connection to an external power source.

Display 116 is optionally included in wearable 100 to enable visual determination of the state of the wearable, such as charge level, etc. In the depicted example, display 116 includes a plurality of LEDs; however, other display elements can be used in display 116 without departing from the scope of the present disclosure.

At operation 202, transducers 104 are provided.

Figure 3A:
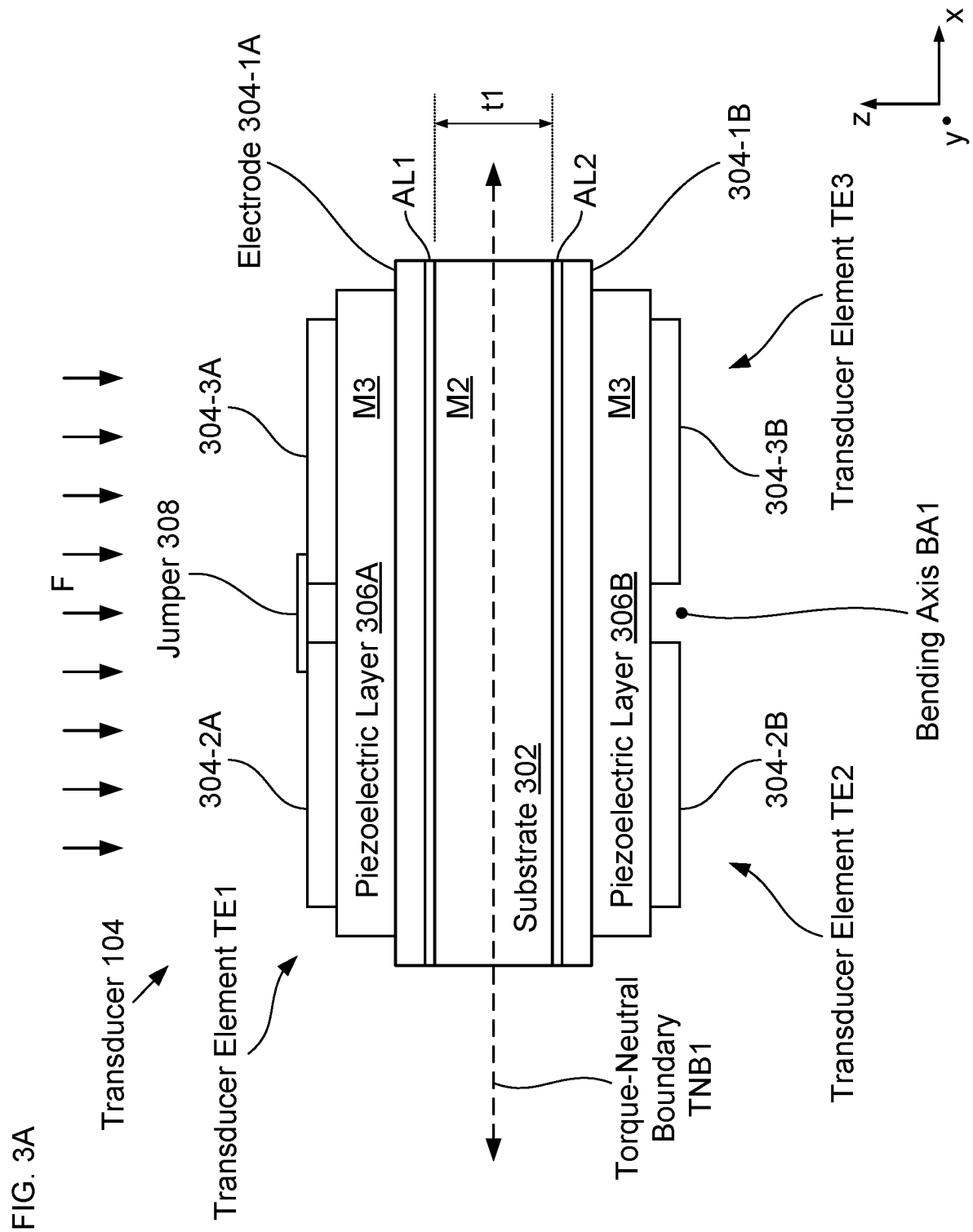

FIGS. 3A-C depict schematic drawings of cross-sectional, top, and bottom views, respectively, of a representative transducer 104 in accordance with the illustrative embodiment.

Transducer 104 includes substrate 302 and transducer elements TE1, TE2, and TE3. Transducer element TE1 is disposed on the top surface of substrate 302, and transducer elements TE2 and TE3 are disposed on the bottom surface of substrate 302, collectively forming a bimorph-transducer structure. Because the physical configuration of transducer element TE1 is substantially equivalent to that of the combination of transducer element TE2 and TE3, the structure is balanced about substrate 302 and transducer 104 is characterized by torque-neutral boundary TNB1, which runs through its central plane.

Transducer 104 is configured to bend about bending axis BA1, which is substantially aligned with longitudinal axis LA2. As indicated in FIG. 3A, bending axis BA1 is located such that is in the plane of the surface of transducer 104 that is distal to the applied force F. However, as will be apparent to one skilled in the art, after reading this Specification, transducer 104 and/or wearable 100 can be designed to locate bending axis BA1 virtually anywhere within or near the transducer.

Transducer element TE1 is configured as a non-resonant energy harvester and includes electrodes 304-1A, 304-2A, and 304-3A, piezoelectric layer 306A, and jumper 308. Transducer element TE1 is configured to generate electrical energy in response to bending of piezoelectric layer 306A due to applied force F.

Transducer element TE2 is configured as a pressure sensor and includes a first portion of electrode 304-1B, electrode 304-2B, and a first portion of piezoelectric layer 306B. Transducer element TE2 is configured to provide an electrical signal whose magnitude is based on the amount of strain induced in the region of piezoelectric layer 306B between electrodes 304-1B and 304-2B by the bending of substrate 302 in response to the applied force. As a result, the electrical signal provided by transducer element TE2 is indicative of the magnitude of applied force F.

Transducer element TE3 is configured as a haptic device and includes a second portion of electrode 304-1B, electrode 304-3B, and a second portion of piezoelectric layer 306B. Transducer element TE3 is configured to generate a vibration signal that is perceptible to the user of wearable 100 in response to a drive signal provided by processor 108. As a result, transducer 100 can provide signals to the user in the case of potential foot slippage, a potential mis-step, detected body-balance issues, as part of behavioral retraining during, for example, physical therapy after a stroke, a wake-up alarm, and the like. In some embodiments, haptic devices are arranged around the perimeter of the foot to enable their use as directional stimuli for helping vision-impaired persons safely navigate through a landscape. In some embodiments, the haptic devices are operatively coupled with a voice-controlled handheld mobile device, or alarm to, for example, provide an audible warning if the user is about to walk into a street intersection with automobiles passing or across train tracks, and the like.

Although the illustrative embodiment includes a multi-function transducer having energy harvesting, sensing, and haptic feedback capabilities, in some embodiments, transducer 104 includes only non-resonant energy harvesters, only a non-resonant energy harvester and a sensor, or only a non-resonant energy harvester and a haptic device.

Figure 4:
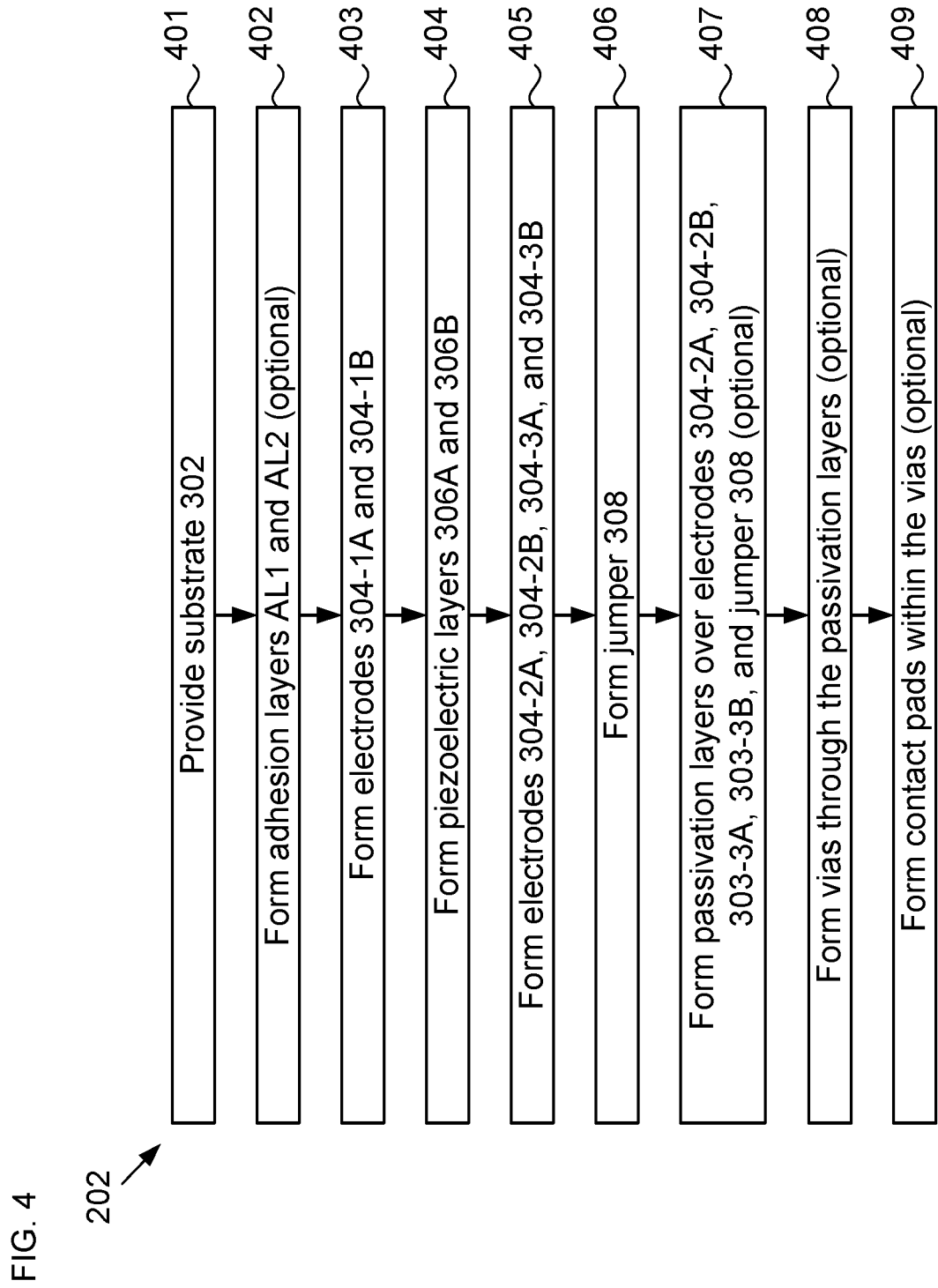
FIG. 4 depicts sub-operations suitable for forming a transducer in accordance with the present disclosure.

FIG. 4 depicts sub-operations suitable for forming a transducer in accordance with the present disclosure. Operation 202 begins with sub-operation 401, wherein substrate 302 is provided.

Substrate 302 is a flexible substrate comprising material M2, which is selected to provide a desired combination of flexibility and yield strength. In the depicted example, material M2 is stainless steel having a Young's modulus ($E_y$) of approximately 190 MPa and a yield strength of approximately 700-750 MPa. The thickness, t1, of substrate 302 depends on the choice of material M1. Typically, t1 is within the range of approximately 10 microns to approximately 1 mm; however, a thickness within the range of approximately 200 microns to approximately 750 microns is preferable for many applications. In the depicted example, t1 is equal to 600 microns. It should be noted, however, that any suitable thickness can be used without departing from the scope of the present disclosure. The use of a metal for substrate 302 affords embodiments in accordance with the present disclosure significant advantages over the prior art, including an ability to match the yield strengths of the substrate material and that of the piezoelectric layers, low cost, well-known production methods, and most metals can be sawed, diced, laser cut, water-jet cut, etc. without requiring exotic methods. Furthermore, most metals suitable for use in substate 302 are available in sheets suitable for use in large production environments, such as large area flat panel or roll-to-roll manufacture.

In some embodiments, M2 is sintered stainless steel, which can have a yield strength up to 1500 MPa depending on sintering temperature and time.

In some embodiments, M2 comprises a different material. Materials suitable for use in substrate 302 include, without limitation, low-Young's modulus materials (e.g., polyimides, polydimethylsiloxane (PDMS), plastics, etc.), moderate-Young's modulus materials (e.g., flexible glasses, Corning Willow® glass, etc.), and high-Young's modulus materials (e.g., metals (e.g., brass, copper, etc.), composite materials, and the like). It should be noted that the use of a different substrate material will not change the output voltage/power/energy of a symmetric bimorph transducer having the same design in every other respect, since the torque-neutral axis or boundary TNB1 and resulting strain of the piezoelectric layers remain unchanged.

Substrate 302 defines the shape of transducer 104. In the depicted example, substrate 302 is a substantially flat (i.e., it is planar in the x-y plane) rectangular plate having longitudinal axis LA2 and short axis SA1. The flat shape of substrate 302 gives rise to a quiescent state for torque-neutral boundary TNB1 that is also flat. In some embodiments, a bimorph transducer has a quiescent shape that is not flat (e.g., curved upward or downward, ruffled, etc.). In such embodiments, the bimorph transducer has a torque-neutral boundary characterized by substantially the same shape.

In some embodiments, substrate 302 has a different shape, such as a square, circle, polygon, an irregular shape, and the like. In some embodiments, substrate 302 (and, therefore, transducer 104) is characterized by a "spring-like" shape arranged in a pre-bent single curved structure or pre-bent multiple-curved serpentine design or path. In some such embodiments, the serpentine path is arranged within a shape outline (i.e., a perimeter) having a shape that is rectangular, square, circular, polygonal, irregular, and the like.

At optional sub-operation 402, adhesion layers AL1 and AL2 are deposited on the top and bottom surfaces of substrate 302, respectively. Adhesion layers AL1 and AL2 are thin layers of material for improving the adhesion between each of electrodes 304-1A and 304-1B and the substrate. Typically, such adhesion layers have a thickness of less than 1000 nm and typically are 100 nm or less. In the depicted example, each of adhesion layers AL1 and AL2 comprises the same material as that of piezoelectric layers or alternate metals such as titanium or molybdenum 306A and 306B, as discussed below. Using titanium (Ti), molybdenum (Mo) or other conduction material as the adhesion layer allows for electrical connection from lower electrodes 304-1A and 304-1B to the metal substrate 302, which may be more manufacturable to electrically connect to by external wiring post fabrication.

At sub-operation 403, electrodes 304-1A and 304-1B are formed on the top and bottom surfaces, respectively of substrate 302.

Electrodes 304-1A and 304-1B are layers of conductive material suitable for providing electrical connectivity to piezoelectric layers 306A and 306B, respectively. In the depicted example, each of electrodes 304-1A and 304-1B is a layer of sputter-deposited molybdenum (Mo) having a thickness of approximately 2000 nm. Preferably, each electrode has a thickness within the range of approximately 100 nm to approximately 2 microns.

It should be noted that the material and thickness used for the electrodes is a matter of design choice. For example, sputtered PZT is preferably deposited on copper or copper alloys (e.g. brass). In each of these cases (AlN or PZT), the aforementioned electrode metals yield the best polycrystalline orientation, which yields the best piezoelectric coefficients $d_{ij}$ (i or j=1, 2 or 3 or equivalently x, y or z), voltage and power/energy output. Yet, provided adequate adhesion can be realized, any metal can be used for the electrodes.

At sub-operation 404, piezoelectric layers 306A and 306B are formed on electrodes 304-1A and 304-1B, respectively.

Each of piezoelectric layers 306A and 306B is a layer of piezoelectric material M3 having a thickness that is typically within the range of approximately 0.5 microns to approximately 10 microns; however, thicknesses of up to several hundred microns can be used for at least one of piezoelectric layers without departing from the scope of the present disclosure. It is preferable that both piezoelectric layers 306A and 306B are equal in thickness so that the torque neutral boundary (or axis) is located at the center of the substrate 302. Such a configuration yields substantially optimal output voltage and power/energy generation. Preferably, material M3 is a low-K piezoelectric material.

In the depicted example, piezoelectric layers 306A and 306B are sputter-deposited layers of undoped aluminum nitride (AlN) having a thickness of approximately one micron. Preferably, the thickness of undoped aluminum nitride used in piezoelectric layers 306A and 306B is within the range of approximately 0.1 to approximately 4.0 microns (provided adhesion of such layers is sufficient to ensure long-term reliability).

In some embodiments, piezoelectric layers 306A and 306B comprise sputtered scandium (Sc) doped aluminum nitride (ScAlN). In some applications, ScAlN is particularly attractive for use in at least one of the piezoelectric layers because it gives rise to larger piezoelectric coefficients $d_{ij}$ (up to 2.5×) for the same deformation as compared to undoped AlN. ScAlN also has up to a 20% lower Young's modulus; therefore, it is more flexible. Since output voltage is proportional to $d_{ij}$ and $E_y$ and output power is proportional to $d_{ij}^2$ and $E^2$, increased energy harvesting can be achieved using the same thickness piezoelectric layers, thereby enabling more voltage/power/energy generation and more flexibility and/or low-profile effectively thinner transducers that are better suited for some wearable applications (e.g., shoe insoles, bras, etc.).

The use of undoped aluminum nitride or scandium-doped aluminum nitride in piezoelectric layers 306A and 306B affords embodiments in accordance with the present disclosure significant advantages over transducers and wearables known in the prior art, including:

i. higher voltage and power/energy generation capability; or
    ii. higher yield strength; or
    iii. significantly lower bending profile; or
    iv. increased flexibility; or
    v. differentially matched yield strength with a steel substrate allowing for fabricating pre-bent structures post AlN or ScAlN deposition; or
    vi. environmental friendliness (no lead content, as opposed to PZT); or
    vii. any combination of i, ii, iii, iv, v, and vi.

It should be noted that, although undoped aluminum nitride or scandium-doped aluminum nitride is preferred for material M3, other piezoelectric materials can be used for at least one of piezoelectric layers 306A and 306B without departing from the scope of the present disclosure. Materials suitable for use in accordance with the present disclosure include, without limitation, thin, magnetron sputtered, low-K piezoelectric materials (e.g., undoped zinc oxide (ZnO), doped ZnO, undoped polyvinylidene fluoride (PVDF), lithium niobate (LiNbO$_3$), etc.), thick high-K piezoelectric materials (e.g., undoped Sol-gel lead zirconate titanate (PZT), doped Sol-gel PZT, etc.), and the like.

Although it is preferable that material M3 is a low-K piezoelectric material, material M3 can comprise a high-K piezoelectric material without departing from the scope of the present disclosure. For example, in some embodiments, one or both of piezoelectric layers 306A and 306B comprises a very thick (e.g. 25 to 250 or more microns) layer of Sol-gel lead-zirconate-titanate (PZT) or doped Sol-gel PZT. Such a layer can be formed, for example, by spin coating, extrusion, lamination, etc. The significantly greater thickness of such a layer can compensate for the high dielectric constant of these materials (PZT has a K in the range of 1700-3500, for instance), which would normally lead to low voltage and poor power generation.

Furthermore, deposition methods other than sputter deposition can be used to form one or both of piezoelectric layers 306A and 306B without departing from the scope of the present disclosure. Alternative deposition methods suitable for forming piezoelectric layers 306A and 306B include, without limitation, Sol-gel coating, chemical-vapor deposition (CVD), plasma-enhanced chemical vapor deposition (PECVD), wet-chemical processing, doctor-blade deposition, spin coating, and the like.

At sub-operation 405, electrodes 304-2A and 304-3A are formed on piezoelectric layer 306A and electrodes 304-2B and 304-3B are formed on piezoelectric layer 306B. Electrodes 304-2A, 304-3A, 304-2B and 304-3B are analogous to electrodes 304-1A and 304-1B described above.

In the depicted example, electrodes 304-2A and 304-3A are optionally separated by a small gap such that they are electrically disconnected. In similar fashion, electrodes 304-2B and 304-3B are also optionally separated by a similar gap. As a result, each electrode can be electrically connected separately if desired. In some embodiments, electrode 304-2A and 304-3A are continuous resulting in one complete electrode on the top of piezoelectric layer 306A.

At sub-operation 406, jumper 308 is formed to electrically connect electrodes 304-2A and 304-3A. Jumper 308 is analogous to electrodes 304-1A and 304-1B described above. The addition of jumper 308 enables electrodes 304-2A and 304-3A to effectively define one large electrode that substantially covers the entirety of the top surface of the piezoelectric layer (neglecting the small gap between electrodes 304-2A and 304-3A, as well as any area around their collective perimeter, which is reserved to provide alignment tolerance during fabrication). As a result, electrode 304-1A, electrode 304-2A, electrode 304-3A, jumper 308, and piezoelectric layer 306A collectively define transducer element TE1 having width W1 and length L1.

At optional sub-operation 407, passivation layers, such as a silicon dioxide or silicon nitride is formed over electrodes 304-2A, 304-3A, 304-2B, 304-3B, and jumper 308.

At optional sub-operation 408, vias are formed through the passivation layers to enable access to each of at least one of electrodes 304-1A, 304-1B, 304-2A and 304-3A, as well as to electrodes 304-2B and 304-3B.

At optional sub-operation 409, contact pads are formed in the vias to enable electrical connections to be made to at least one of electrodes 304-1A, 304-1B, 304-2A and 304-3A, as well as to electrodes 304-2B and 304-3B.

It should be noted that, in some embodiments, the maximum layer thicknesses of the constituent layers of transducer 104 yield a transducer whose thickness is less than approximately 1.3 mm when it is in its quiescent state (as depicted in FIG. 3A). As a result, transducers in accordance with the present disclosure can be included in wearables for which large transducer thickness would be problematic, such as shoe insoles, midsoles or outsoles, garments, bras, handbags, backpacks, and the like. In some embodiments, the thickness of transducer 104, in its quiescent state, is within the range of approximately 100 microns to approximately 210 microns.

Returning now to method 200, in operation 203, transducers 104 are arranged in the molding form for insole body 102. In the depicted example, transducers 104 are arranged in a substantially linear arrangement in which the short axis, SA1, of each transducer is substantially aligned with longitudinal axis LA1 of insole body 102. As a result, the arrangement of transducers can "roll up" along longitudinal axis LA1 (like a venetian blind) as insole 102 deforms during a stride of the user.

Although the depicted example includes a plurality of substantially identical transducers 104 that is arranged in a linear arrangement within wearable 100, a plurality of transducers within a wearable can include different transducers and/or be arranged in any practical one-, two-, or three-dimensional arrangement without departing from the scope of the present disclosure. For example, a smart connected insole in accordance with the present disclosure can include a plurality of transducers 104 having a shorter length, or circular transducers, etc., in the narrower instep region of the insole.

At operation 204, the components within wearable 100 are electrically connected such that power is provided by the non-resonant energy harvesters of transducers 104 via energy storage module 112.

Figure 5:
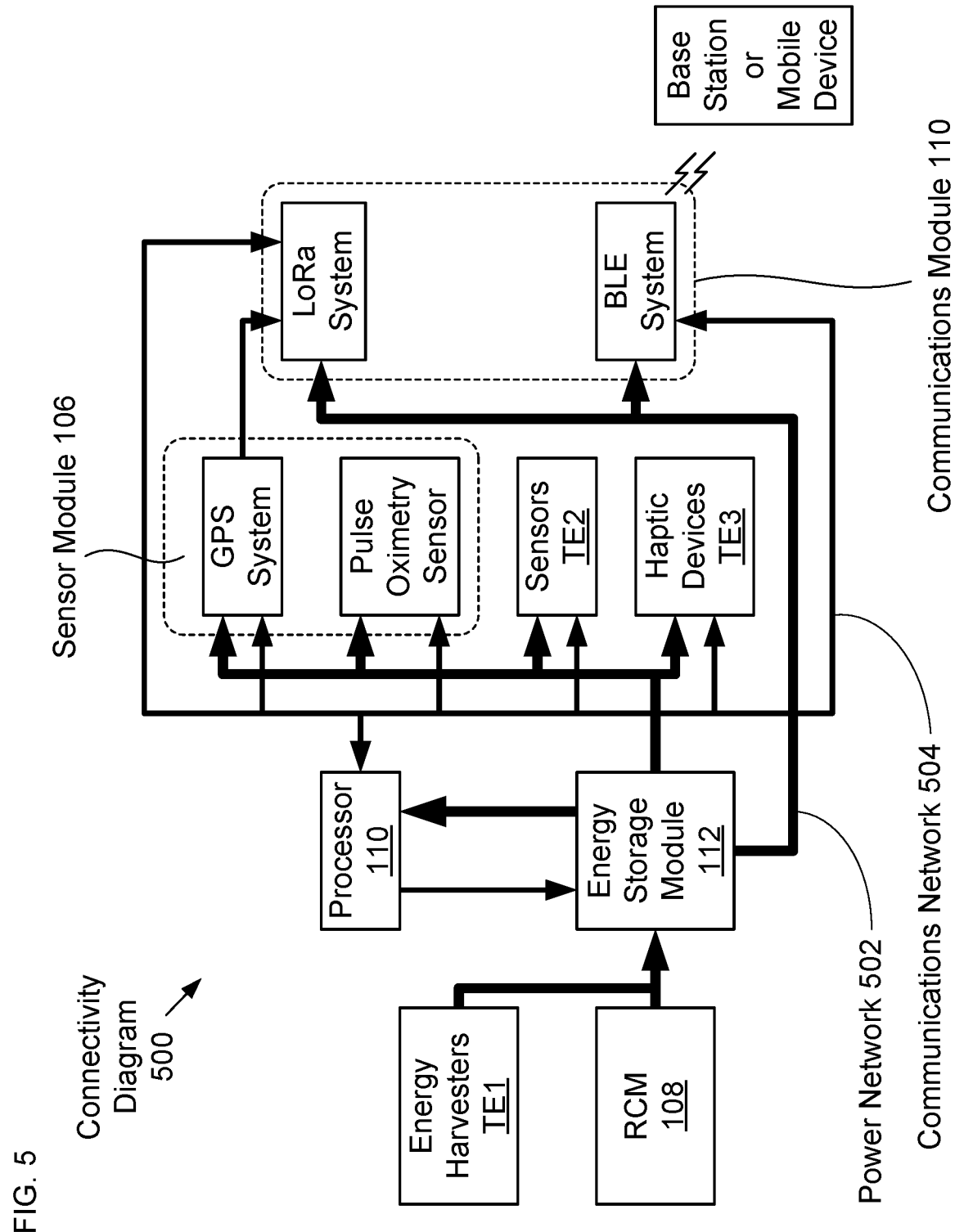
FIG. 5 depicts a block diagram showing component connectivity for a wearable in accordance with the present disclosure.

FIG. 5 depicts a block diagram showing component connectivity for a wearable in accordance with the present disclosure.

As seen in connectivity diagram 500, wearable 100 includes two substantially independent networks—power network 502 and communications network 504.

In power network 502, energy storage module 112 receives energy from each of rapid-charging module 108 and the non-resonant energy harvesters TE1 included in the plurality of transducers 104 and distributes the energy, as needed, to other components within wearable 100, including processor 108, sensor module 106, the force/load/pressure sensors TE2 included in the plurality of transducers 104, the haptic devices TE3 included in the plurality of transducers 104, and communications module 110.

In communications network 504, energy data and control signals are transmitted between processor 108 and the components in sensor module 106, communications module 110, and energy storage module 112.

At operation 205, insole body 102 is formed by filling the mold with material M1, which fully encases transducers 104-1 through 104-N, sensor module 106, processor 108, communications module 110, energy-storage module 112, rapid-charging module 114, and display 116 within the insole, thereby protecting each of these components from damage due to water, sweat, and the like. In some embodiments, display 116 is encased within insole body 102 such that its display elements are visible to the user when desired.

In the depicted example, material M1 is polyurethane (PU) formed in a two-layer structure comprising a lower portion of relatively higher-density polyurethane and an upper portion of relatively lower-density polyurethane.

It is an aspect of the present disclosure that the two-layer structure of insole body 102 fosters bending-strain-based operation of transducers 104. It should be noted, however, that material M1 can include any suitable material, such as a monolayer of polyurethane, mono- or multi-layers of viscoelastic gels, neoprene rubbers, foams, and the like without departing from the scope of the present disclosure.

Although the illustrative embodiment includes rectangular piezoelectric transducers, in some embodiments, at least one piezoelectric transducer in a wearable has a non-rectangular shape. In some embodiments the non-rectangular shape (e.g. circular) piezoelectric transducers may be used as a force sensor (e.g. step-counter) or as a haptic device or both.

Figure 6A:
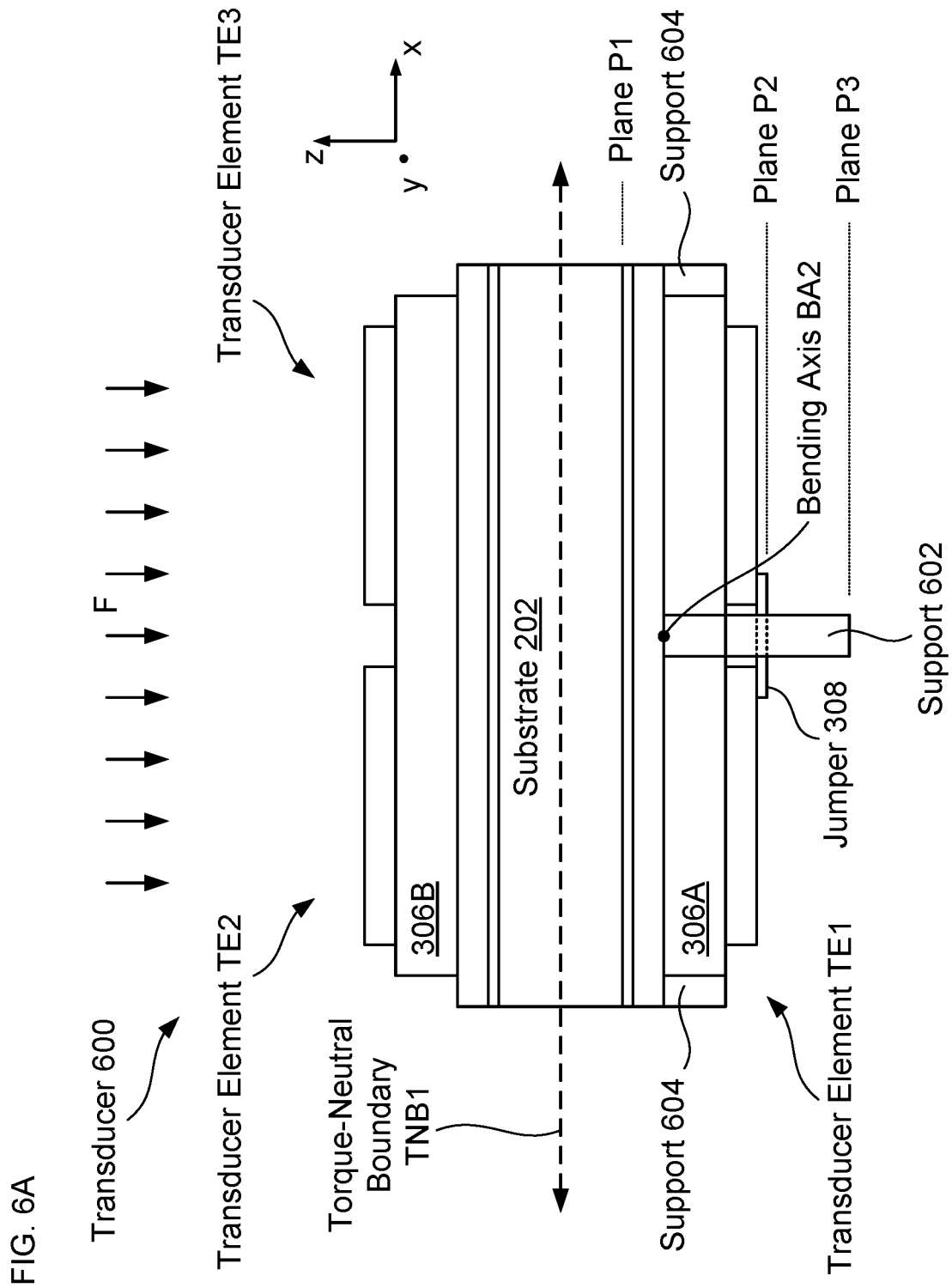
FIG. 6A depicts a schematic drawing of a cross-sectional view of an alternative embodiment of a transducer in accordance with the present disclosure.

FIG. 6A depicts a schematic drawing of a cross-sectional view of an alternative embodiment of a transducer in accordance with the present disclosure. Transducer 600 comprises transducer 104, support 602, and supports 604. Transducer 600 is configured to selectively give rise to a bending-strain-based response to applied force F while simultaneously inhibiting compression of the piezoelectric layer of transducer element TE1.

Support 602 is a substantially mechanically rigid structural support (e.g., a pedestal, stand-off, etc.) that projects through piezoelectric layer 306A from substrate 302.

In the depicted example, plane P1 is defined by the bottom surface of substrate 302 (the surface proximal to transducer element TE1).

Plane P2 is defined by the outermost surface of transducer element TE1, which in the depicted example, is the outermost surface of jumper 308. In some embodiments, plane P2 is defined by the outermost surface of piezoelectric layer 306A.

Plane P3 is defined by the surface of support 602 that is distal to substate 302.

Support 602 and transducer element TE1 are configured such that plane P2 lies between planes P1 and P3. As a result, when force F is applied to transducer 600, support 602 functions as a fulcrum about which the transducer bends, thereby defining bending axis BA2.

Transducer 600 also includes optional supports 604, which are distributed within piezoelectric layer 306A and have substantially the same thickness as the piezoelectric material. As a result, supports 604 mitigate compression of piezoelectric layer 306A in response to applied force F.

As seen in connectivity diagram 500, wearable 100 includes two substantially independent networks—power network 502 and communications network 504.

FIGS. 6B-C depict schematic drawings of cross-sectional views of another alternative embodiment of a transducer in its quiescent and deflected states, respectively, in accordance with the present disclosure. Transducer 606 comprises transducer 104, seat 608, and support 610. Transducer 600 is configured to foster a bending-strain-based response to applied force F while also providing overstrain protection.

Seat 608 is a curved recess containing support 610. Seat 608 is located beneath transducer 104 and configured such that the transducer comes to a rest against support 610 when it bends in response to applied force F, thereby defining bending axis BA3. As a result, support 610 both acts as a fulcrum about which the transducer bends and as a restraint that mitigates overstrain in the transducer.

Figure 6D:
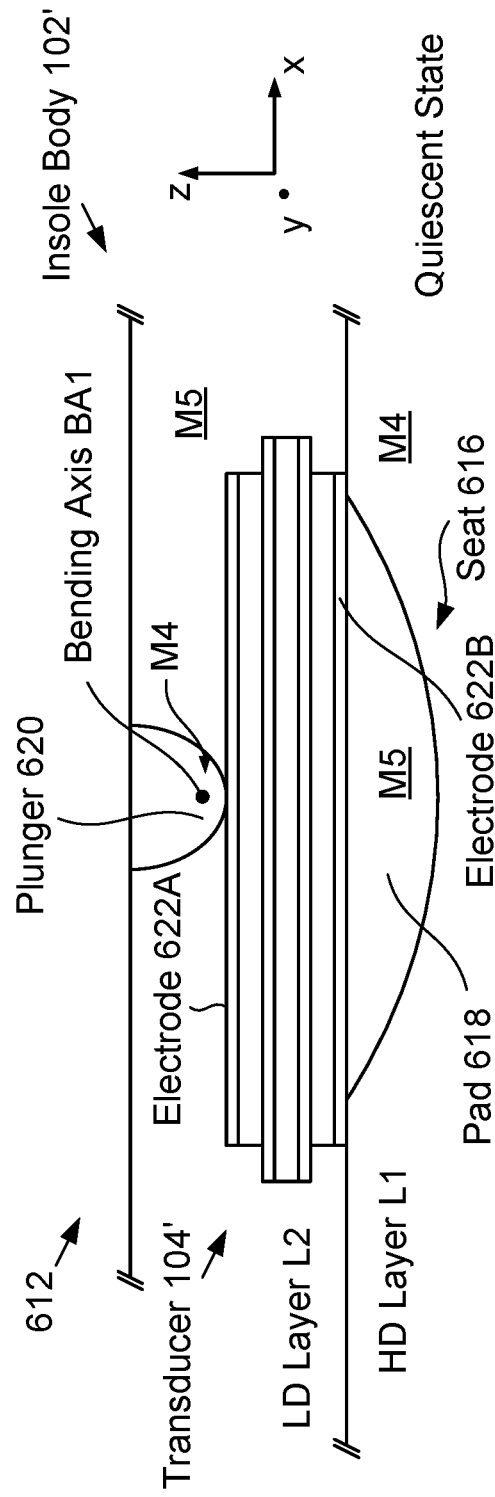
FIGS. 6D-E depict schematic drawings of cross-sectional views of a wearable, in its quiescent and deflected states, respectively, that is arranged to substantially selectively enable bending of a transducer in accordance with the present disclosure.
Figure 6E:
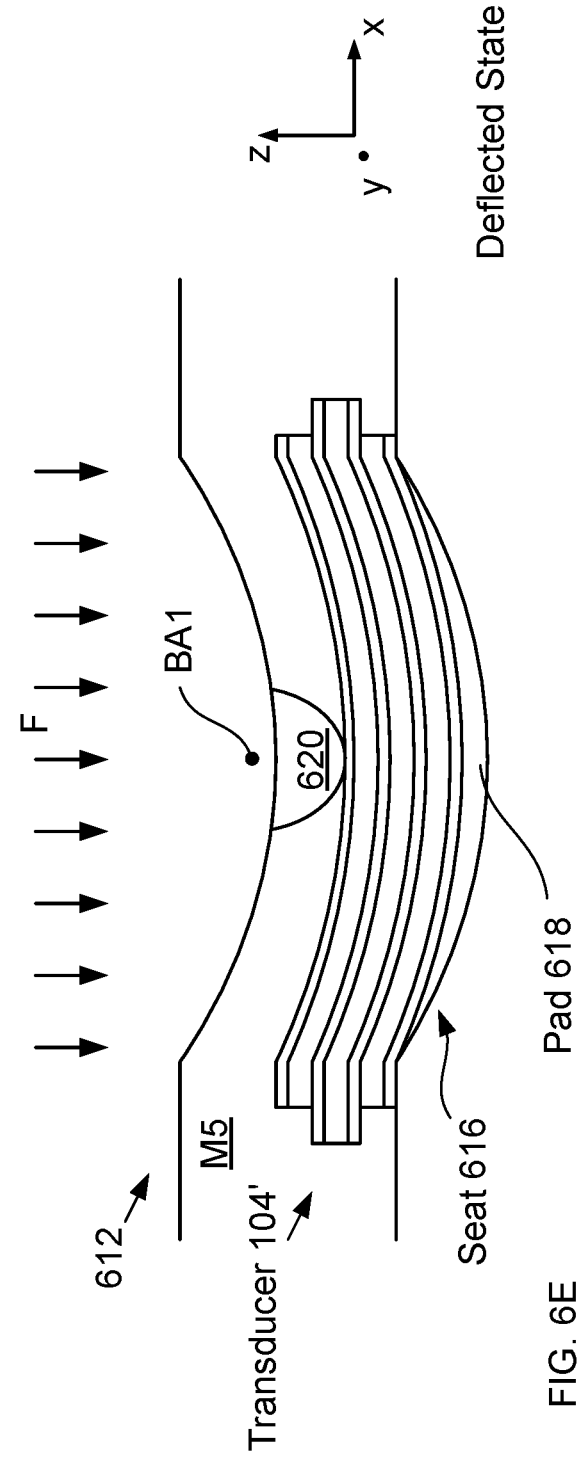

FIGS. 6D-E depict schematic drawings of cross-sectional views of a wearable, in its quiescent and deflected states, respectively, that is arranged to substantially selectively enable bending of a transducer in accordance with the present disclosure. Wearable 612 comprises insole body 102', transducer 104', seat 616, pad 618, and plunger 620. Wearable 612 is configured to foster a bending-strain-based response in transducer 104' in response to applied force F while avoiding significant compression of the piezoelectric layers of the transducer, while also providing overstrain protection.

Transducer 104' is analogous to transducer 104 described above; however, transducer 104' includes electrodes 622A and 622B, which are full-surface electrodes that substantially cover the entirety of piezoelectric layers 306A and 306B, respectively. In the depicted example, transducer 104' includes a top transducer element that is configured as a non-resonant energy harvester and a bottom transducer element that is configured as a pressure sensor. In some embodiments, transducer 104' comprises a different combination of non-resonant energy harvesters, pressure sensors, and haptic devices.

Insole body 102' includes HD layer L1 and LD layer L2. HD layer L1 comprises a relatively higher-density material M4, while LD layer L2 comprises a relatively lower-density material M5. In the depicted example, material M4 is high-density polyurethane and material M5 is a low-density polyurethane; however, any materials suitable for use in insole body 102 described above can be used in insole body 102' without departing from the scope of the present disclosure. In some embodiments, pad 618 comprises air.

HD layer L1 includes seat 616, which is a rounded cavity formed into the surface of the layer. Seat 616 is filled with material M5 such that compression in response to force F can be concentrated at seat 616.

Transducer 104' is disposed above seat 616 such that the transducer can bend in response to force F. In the depicted example, transducer 104' is supported at both ends above seat 616; however, in some embodiments, transducer 104' is supported above the seat by anchoring it on only one side (i.e., it is cantilevered over the seat).

Plunger 620 is a structure embedded within LD layer L2 and disposed on transducer 104'. Plunger 620 is configured to be more resistant to deformation than the material surrounding it and, therefore concentrates force F into a localized region on the top of transducer 104'. In the depicted example, plunger 620 comprises material M4; however, any material having relatively higher density that the material of LD layer L2 can be used without departing from the scope of the present disclosure.

As depicted in FIG. 6E, when force F is applied to wearable 612, transducer 104' bends downward into seat 616, thus compressing the material of pad 618.

It should be noted that seat 616 functions as a pre-form for the deflected shape of transducers 104' and also mitigates the potential for overstressing the layers of the transducer.

FIGS. 7A-B depict schematic drawings of top and bottom views, respectively, of yet another alternative embodiment of a transducer in accordance with the present disclosure. Transducer 700 is analogous to transducer 104 and has substantially the same layer structure; however, transducer 700 has a circular shape. The circular shape of transducer 700 affords advantages in some applications. For example, a two-dimensional arrangement of transducers 700 can be included in a shoe insole, such as wearable 100, to provide a two-dimensional map of pressure distribution across the foot of a user, or as a distribution of haptic vibration devices to function, for example, as directional indictors/alarms. In some embodiments, a wearable includes a single haptic device for providing mobile phone and health alerts.

As will be apparent to one skilled in the art, after reading this Specification, transducer 700 is radially symmetric about its center point, C1, and, therefore, either if its longitudinal and short axes can be considered as any line passing through C1.

As noted briefly above, in some embodiments, it can be beneficial for a bimorph transducer to have a quiescent shape that is not flat (e.g., curved upward or downward, ruffled, etc.).

Figure 8A:
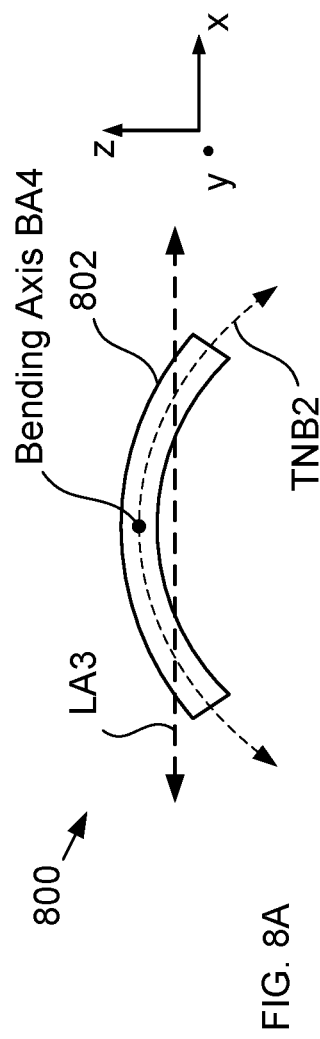
FIGS. 8A-C depict schematic drawings of cross-sectional views of alternative embodiments of bimorph transducers in accordance with the present disclosure.
Figure 8B:
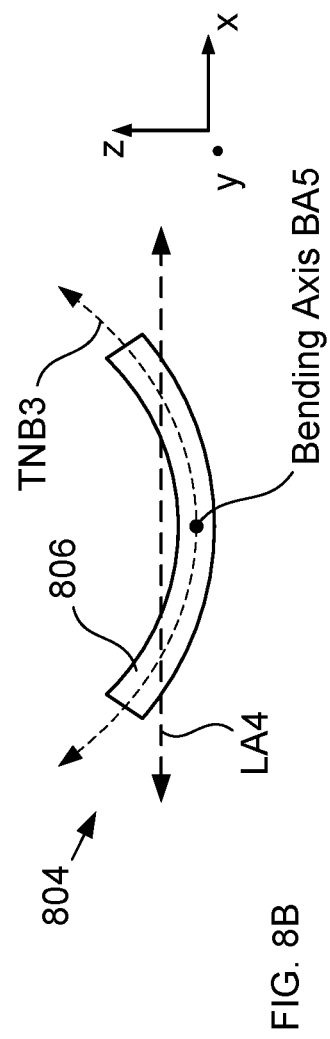
Figure 8C:
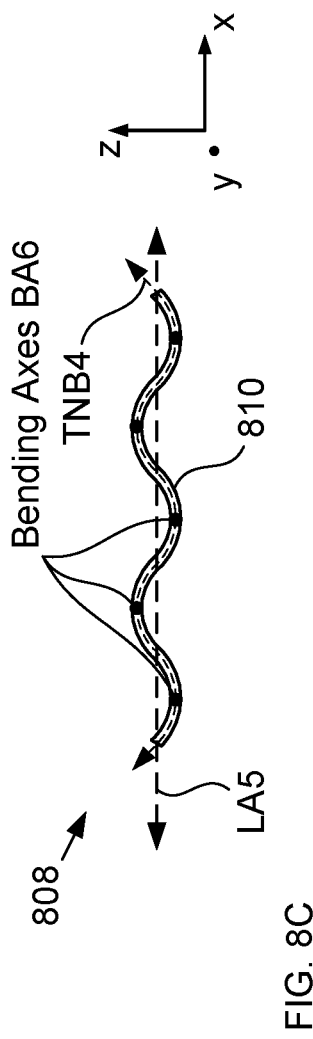

FIGS. 8A-C depict schematic drawings of cross-sectional views of alternative embodiments of bimorph transducers in accordance with the present disclosure. Each of transducers 800, 804, and 808 is analogous to transducer 104 described above and with respect to FIGS. 3A-C and contains substantially the same layer structure. However, for clarity, only the substrate and torque-neutral boundary TNB of each of the transducers are shown in FIGS. 8A-C.

Transducer 800 includes non-planar substrate 802, which is characterized by longitudinal axis LA3 and has a quiescent state in which it bends downward about bending axis BA4 along longitudinal axis LA3 with a substantially uniform radius of curvature (ROC). As a result, substrate 802 is non-planar in the x-y plane and the torque-neutral boundary TNB2 of transducer 800 also bends downward along longitudinal axis LA3 with substantially the same ROC. In some embodiments, a "bent" transducer has a non-uniform ROC across at least one of its lateral dimensions. In some embodiments, a transducer is curved along a direction other than its longitudinal axis, such as its short axis (not shown).

Typically, the non-planar state of transducers 800 is realized by bending substrate 802, as well as the other constituent layers of the transducer into its desired quiescent shape after all of these layers have been formed. It should be noted, therefore, that the strain level at which plastic deformation occurs in each layer must not be exceeded during the bending process. As a result, the desired quiescent shape of transducer 800 informs the choice of materials for each of the substrate, piezoelectric layers, and electrodes of the transducer.

Transducer 804 is analogous to transducer 800 and includes substate 806, which is characterized by longitudinal axis LA4. However, transducer 804 has a quiescent state in which it is bent in the opposite direction from that of transducer 800. As a result, substrate 806 is also non-planar in the x-y plane and the torque-neutral boundary TNB3 of transducer 804 also bends upward about bending axis BA5 along longitudinal axis LA4 with substantially the same ROC.

Transducer 808 is analogous to transducers 800 and 804 and is substantially a combination of their structures. Transducer 808 includes substrate 810 and has a quiescent state in which it is "ruffled" relative to the x-y plane. In other words, substrate 810 is bent upward about each of a first plurality of bending axes BA6 along some portions of longitudinal axis LA5 and bent downward about each of a second plurality of bending axes BA6 along intervening portions of the longitudinal axis. As a result, torque-neutral boundary TNB4 of transducer 808 also bends upward and downward along longitudinal axis LA5.

It should be noted that, in some embodiments, a transducer includes a substrate that is bent upward and/or downward in a two-dimensional pattern (e.g., along both the x-direction and the y-direction).

FIGS. 9A-D depict schematic drawings of cross-sectional views of wearables having alternative arrangements of bimorph transducers within a wearable in accordance with the present disclosure. Each of wearables 900, 902, 904, and 906 is analogous to wearable 100 and comprises insole body 102 and one or more transducers analogous to transducer 104. It should be noted that, for clarity, only transducers 104 and their respective bending axes are shown in FIGS. 9A-D.

Wearable 900 includes transducer 104A, which is a long version of transducer 104 and arranged within insole body 102 such that bending axis BA1A is aligned with longitudinal axis LA1. As a result, transducer 104A can generate voltage and energy in response to a rolling motion of the user's foot, as well as during each step as the shoe meets the ground or lifts from it.

Wearable 902 includes a pair of transducers 104B, each of which is a short version of transducer 104. Transducers 104B are arranged within insole body 102 such that each of their bending axes BA1B is aligned with longitudinal axis LA1. Although the depicted example includes two transducers that are displaced from longitudinal axis LA1, in some embodiments, the bending axis of at least one transducer is colinear with the longitudinal axis of its wearable.

Wearable 904 includes a combination of transducers that includes one transducer 104A and a pair of transducers 104B. Transducers 104A and 104B are arranged within insole body 102 such that each of their bending axes BA1A and BA1B is aligned with longitudinal axis LA1.

Wearable 906 includes a plurality of transducers 104B, which is arranged within insole body 102 such that each of their bending axes BA1A and BA1B is aligned with longitudinal axis LA1. The arrangement of transducers includes two linear arrays located approximately at the heel and ball-and-foot areas of the insole body, as well as a single transducer 104B located near the arch region of the insole body.

It is to be understood that the disclosure teaches just some exemplary embodiments and that many variations of the invention can easily be devised by those skilled in the art after reading this disclosure and that the scope of the present invention is to be determined by the following claims.

What is claimed is:

1. A wearable apparatus comprising:
   (a) a transducer having a longitudinal axis that defines a first direction, wherein the transducer is a bending-strain-based transducer that includes:
      (i) a first transducer element disposed on a first surface of a substrate, the first transducer element being a non-resonant energy harvester;
      (ii) a second transducer element disposed on a second surface of the substrate, the first and second surfaces being on opposite sides of the substrate, wherein the second transducer element is selected from the group consisting of a resonant energy harvester, a non-resonant energy harvester, a force sensor, a load sensor, a pressure sensor, and a haptic device;
      wherein the transducer is configured to bend in response to a first force that is at least partially directed along a second direction that is orthogonal to the first direction;
      wherein the first transducer element is configured to provide a first output signal; and
      wherein the second transducer element is configured to provide a second output signal or generate a first mechanical signal based on a first input signal;
      (iii) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;
   (b) a power handling circuit; and
   (c) an energy storage module operatively coupled with the transducer and configured to store energy generated by the non-resonant energy harvesters, and provide power to the transducer and the other electronics included in the wearable apparatus.

2. A wearable apparatus comprising:
   (a) a transducer having a longitudinal axis that defines a first direction, wherein the transducer is a bending-strain-based transducer that includes:
      (i) a first transducer element disposed on a first surface of a substrate, the first transducer element being a non-resonant energy harvester;
      (ii) a second transducer element disposed on a second surface of the substrate, the first and second surfaces being on opposite sides of the substrate, wherein the second transducer element is selected from the group consisting of a resonant energy harvester, a non-resonant energy harvester, a force sensor, a load sensor, a pressure sensor, and a haptic device;
      (iii) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;

wherein the transducer is configured to bend in response to a first force that is at least partially directed along a second direction that is orthogonal to the first direction;

wherein the first transducer element is configured to provide a first output signal; and wherein the second transducer element is configured to provide a second output signal or generate a first mechanical signal based on a first input signal;

wherein the transducer is further configured to inhibit compression of at least one of the first and second transducer elements along the second direction in response to the first force;

(b) a power handling circuit; and (c) an energy storage module operatively coupled with the transducer and configured to store energy generated by the non-resonant energy harvesters, and provide power to the transducer and the other electronics included in the wearable apparatus.

3. A wearable apparatus comprising:
(a) a transducer having a longitudinal axis that defines a first direction, wherein the transducer is a bending-strain-based transducer that includes:
(i) a first transducer element disposed on a first surface of a substrate, the first transducer element being a non-resonant energy harvester;
(ii) a second transducer element disposed on a second surface of the substrate, the first and second surfaces being on opposite sides of the substrate, wherein the second transducer element is selected from the group consisting of a resonant energy harvester, a non-resonant energy harvester, a force sensor, a load sensor, a pressure sensor, and a haptic device;
(iii) a third transducer element disposed on the second surface, and wherein the third transducer element is a haptic device;
(iv) a mechanically rigid structural support aligned with a second direction, the first transducer element having a third surface that is distal to the substrate and defines a first plane, and wherein the mechanically rigid structural support extends along the second direction to define a second plane, and further wherein the first plane is between the substrate and the second plane; wherein the mechanically rigid structural support functions as a fulcrum about which the transducer bends;

wherein the transducer is configured to bend in response to a first force that is at least partially directed along a second direction that is orthogonal to the first direction;

wherein the first transducer element is configured to provide a first output signal; and wherein the second transducer element is configured to provide a second output signal or generate a first mechanical signal based on a first input signal;

(b) a power handling circuit; and (c) an energy storage module operatively coupled with the transducer and configured to store energy generated by the non-resonant energy harvesters, and provide power to the transducer and the other electronics included in the wearable apparatus.

4. The wearable apparatus of claim 1 wherein the wearable is selected from the group consisting of a shoe insole, a shoe midsole, and an outsole.

5. The wearable apparatus of claim 1 wherein the substrate comprises a material selected from the group consisting of a polyimide and a glass.

6. The wearable apparatus of claim 1 wherein the substrate comprises a metal.

7. The wearable apparatus of claim 1 wherein the first transducer element includes first and second electrodes and a piezoelectric layer that is between the first and second electrodes.

8. The wearable apparatus of claim 7 wherein the piezoelectric layer comprises a low-K piezoelectric material.

9. The wearable apparatus of claim 8 wherein the low-K piezoelectric material is selected from the group consisting of undoped aluminum nitride, doped aluminum nitride, scandium-doped aluminum nitride, undoped zinc oxide, doped zinc oxide, and polyvinylidene fluoride.

10. The wearable apparatus of claim 7 wherein the piezoelectric layer comprises a thick high-K piezoelectric material.

11. The wearable apparatus of claim 7 wherein the high-K piezoelectric material comprises thick lead-zirconate-titanate or doped lead-zirconate-titanate.

12. The wearable apparatus of claim 1 wherein the transducer has a quiescent shape that is non-linear in a first plane that includes the second direction, and wherein transducer is configured to deform from its quiescent shape in the first plane in response to the first force.

13. A wearable apparatus comprising a first bimorph transducer having a first longitudinal axis that defines a first direction, wherein the first bimorph transducer is a bending-strain-based transducer that includes:
(a) a first transducer element disposed on a first surface of a substrate, the first transducer element being a non-resonant energy harvester that provides a first output signal;
(b) a second transducer element disposed on a second surface of a substrate, the second transducer element being a sensor that provides a second output signal; and
(c) a third transducer element configured to provide a mechanical signal in response to a first input signa, wherein the third transducer element is a haptic device;
(d) a mechanically rigid structural support aligned with a second direction that is orthogonal to the first direction, the first transducer element having a surface that is distal to the substrate and defines a first plane, and wherein the mechanically rigid structural support extends along the second direction to define a second plane, and wherein the first plane is between the substrate and the second plane, wherein the mechanically rigid structural support functions as a fulcrum about which the transducer bends;

wherein the first bimorph transducer is further configured to inhibit compression of the first transducer element along the second direction in response to the first force wherein the first bimorph transducer is configured to bend in response to a first force directed at least partially along the second;

wherein the wearable further includes a power handling circuit and an energy storage module operatively coupled with the first bimorph transducer and configured to store energy generated by the non-resonant energy harvesters, and provide power to the first bimorph transducer and the other electronics included in wearable.

14. The wearable apparatus of claim 13 wherein the first transducer element includes a piezoelectric layer located between first and second electrical contacts.

15. The wearable apparatus of claim 13 wherein the substrate comprises at least one material selected from the group consisting of a metal, a polyimide, and a glass.

16. The wearable apparatus of claim 13 wherein the wearable includes:
a plurality of bimorph transducers that includes the first bimorph transducer;
a wireless communications module
wherein the plurality of bimorph transducers is operatively coupled with each of the power-handling circuit and the energy-storage module.

17. The wearable apparatus of claim 16 wherein shoe insole defines a first plane and has a second longitudinal axis in the first plane, and wherein each bimorph transducers of the plurality thereof has a first lateral dimension along the first direction in the first plane and a second lateral dimension that is aligned with the second longitudinal axis, the second lateral dimension being smaller than the first lateral dimension.

18. The wearable apparatus of claim 13 wherein the first bimorph transducer has a quiescent shape that is non-linear in a first plane that includes the second direction, and wherein the first bimorph transducer is configured to deform from its quiescent shape in the first plane in response to the first force.

19. The wearable apparatus of claim 18 further comprising a plurality of bimorph transducers that includes the first bimorph transducer, wherein the plurality of bimorph transducers is linearly arranged along the second direction.

20. The wearable apparatus of claim 13 further comprising an element selected from the group consisting of an accelerometer and an inertial sensor.

21. The wearable apparatus of claim 13 further comprising a location module that is configured to provide an alert in response to a magnitude of a separation between the first bimorph transducer and a first location.

22. The wearable apparatus of claim 1 wherein the transducer has a quiescent state in which the transducer has a thickness that is less than 1.3 millimeters.

23. The wearable apparatus of claim 1 wherein the transducer has a quiescent state in which the transducer has a thickness that is less than 620 microns.

24. The wearable apparatus of claim 1 wherein the transducer has a quiescent state in which the transducer has a thickness that is within the range of 100 microns to 210 microns.

25. The wearable apparatus of claim 1 wherein at least one of the first transducer element and second transducer element includes a piezoelectric layer having a thickness that is less than or equal to 500 microns.

26. The wearable apparatus of claim 4 wherein the wearable is configured to enable its reversible insertion into a footwear.

27. The wearable apparatus of claim 26 wherein the footwear is selected from the group consisting of a shoe, a high-heel shoe, a sneaker, a cleat, and a slipper.

28. The wearable apparatus of claim 4 wherein the wearable is non-reversibly integrated into a footwear.

29. The wearable apparatus of claim 28 wherein the footwear is selected from the group consisting of a shoe, a high-heel shoe, a sneaker, a cleat, and a slipper.

30. The wearable apparatus of claim 13 wherein the first bimorph transducer has a quiescent state in which the transducer is characterized by a thickness that is less than 1.3 millimeters.

31. The wearable apparatus of claim 30 wherein the transducer has a quiescent state in which the transducer is characterized by a thickness that is within the range of 100 microns to 210 microns.

* * * * *